(12) United States Patent
Bang et al.

(10) Patent No.: US 7,372,616 B2
(45) Date of Patent: May 13, 2008

(54) COMPLEX MICRODEVICES AND APPARATUS AND METHODS FOR FABRICATING SUCH DEVICES

(75) Inventors: Christopher A. Bang, San Diego, CA (US); Adam L. Cohen, Los Angeles, CA (US); Michael S. Lockard, Lake Elizabeth, CA (US); John D. Evans, Arlington, VA (US)

(73) Assignee: Microfabrica, Inc., Van Nuys, CA (US)

( * ) Notice: Subject to any disclaimer, the term of this patent is extended or adjusted under 35 U.S.C. 154(b) by 242 days.

(21) Appl. No.: 11/139,391

(22) Filed: May 27, 2005

(65) Prior Publication Data

US 2005/0221529 A1   Oct. 6, 2005

Related U.S. Application Data

(63) Continuation of application No. 10/313,795, filed on Dec. 6, 2002, now Pat. No. 7,185,542.

(60) Provisional application No. 60/429,484, filed on Nov. 26, 2002, provisional application No. 60/429,483, filed on Nov. 26, 2002, provisional application No. 60/422,982, filed on Nov. 1, 2002, provisional application No. 60/422,007, filed on Oct. 29, 2002, provisional application No. 60/392,531, filed on Jun. 27, 2002, provisional application No. 60/415,374, filed on Oct. 1, 2002, provisional application No. 60/379,184, filed on May 7, 2002, provisional application No. 60/430,809, filed on Dec. 3, 2002, provisional application No. 60/379,182, filed on May 7, 2002, provisional application No. 60/379,135, filed on May 7, 2002, provisional application No. 60/415,371, filed on Oct. 1, 2002, provisional application No. 60/379,133, filed on May 7, 2002, provisional application No. 60/340,372, filed on Dec. 6, 2001, provisional application No. 60/364,261, filed on Mar. 13, 2002.

(51) Int. Cl.
*G02B 26/00* (2006.01)
*C25D 1/00* (2006.01)
*C25D 7/00* (2006.01)
*H01L 21/00* (2006.01)

(52) U.S. Cl. .................. 359/291; 359/295; 205/71; 205/116; 438/717; 438/738

(58) Field of Classification Search ............... 359/291, 359/295; 438/717, 738; 205/71, 116
See application file for complete search history.

(56) References Cited

U.S. PATENT DOCUMENTS 5,190,637 A  3/1993  Guckel ..................... 205/118

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

(Continued)

*Primary Examiner*—Helen Kwok
(74) *Attorney, Agent, or Firm*—Dennis R. Smalley

(57) ABSTRACT

Various embodiments of the invention are directed to various microdevices including sensors, actuators, valves, scanning mirrors, accelerometers, switches, and the like. In some embodiments the devices are formed via electrochemical fabrication (EFAB™).

15 Claims, 36 Drawing Sheets

U.S. PATENT DOCUMENTS

| | | | |
|---|---|---|---|
| 5,914,801 A | 6/1999 | Dhuler et al. | 359/230 |
| 6,027,630 A | 2/2000 | Cohen | 205/135 |
| 6,087,747 A | 7/2000 | Dhuler et al. | 310/90 |
| 6,134,042 A | 10/2000 | Dhuler et al. | 359/224 |
| 6,201,629 B1 | 3/2001 | McClelland et al. | 359/223 |
| 6,329,738 B1 | 12/2001 | Hung et al. | 310/309 |
| 6,353,492 B2 | 3/2002 | McClelland et al. | 359/254 |
| 6,428,173 B1 | 8/2002 | Dhuler et al. | 359/872 |
| 6,445,841 B1 | 9/2002 | Gloeckner et al. | 385/17 |
| 6,449,079 B1 | 9/2002 | Herrmann | 359/214 |
| 6,449,406 B1 | 9/2002 | Fan et al. | 385/17 |
| 6,498,870 B1 | 12/2002 | Wu et al. | 385/18 |
| 6,535,663 B1 | 3/2003 | Chertkow | 385/18 |
| 6,538,799 B2 | 3/2003 | McClelland et al. | 359/291 |
| 6,647,164 B1 | 11/2003 | Weaver et al. | 385/16 |
| 6,694,071 B2 | 2/2004 | Hsu | 385/16 |
| 6,701,038 B2 | 3/2004 | Rensing et al. | 385/18 |
| 6,744,173 B2 | 6/2004 | Behin et al. | 310/309 |
| 6,819,822 B2 | 11/2004 | Behin et al. | 385/18 |
| 6,914,710 B1 | 7/2005 | Novotny et al. | 359/291 |
| 7,005,385 B2 * | 2/2006 | Kundalgurki | 438/694 |
| 7,071,594 B1 | 7/2006 | Yan et al. | 310/309 |
| 7,095,546 B2 | 8/2006 | Mala et al. | 359/290 |
| 7,185,542 B2 | 3/2007 | Bang et al. | 73/514.29 |
| 7,187,100 B2 | 3/2007 | Fu | 310/309 |
| 7,190,507 B2 | 3/2007 | Sato | 359/291 |
| 7,250,101 B2 * | 7/2007 | Thompson et al. | 205/67 |
| 7,282,775 B2 | 10/2007 | Fu | 357/415 |
| 7,291,254 B2 * | 11/2007 | Cohen et al. | 205/135 |
| 7,301,692 B2 * | 11/2007 | Ko et al. | 359/291 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

* cited by examiner

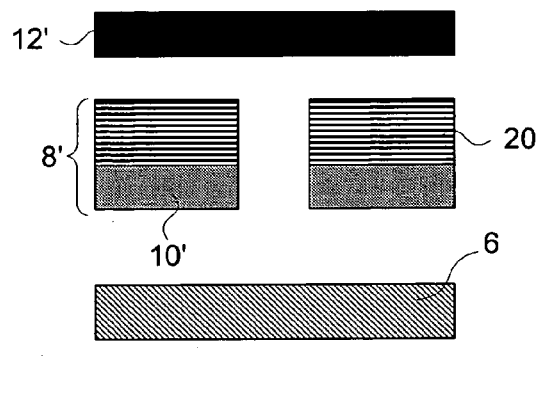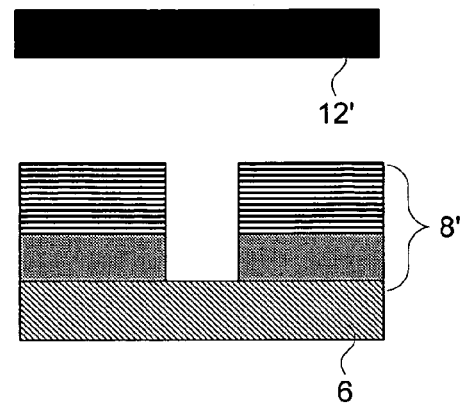
FIG 1D    FIG 1E
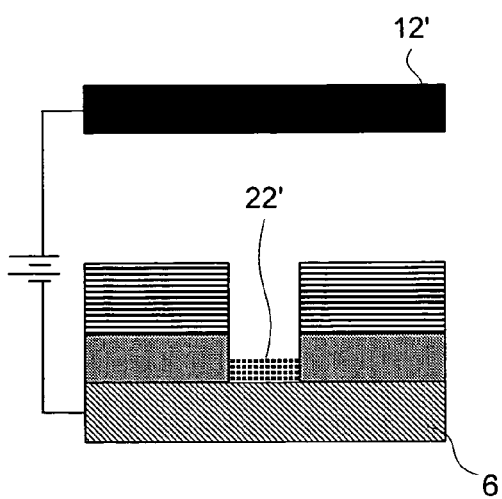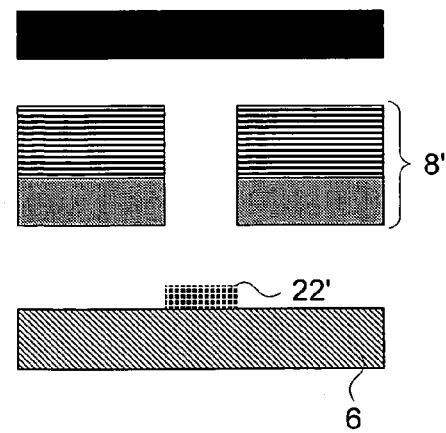
FIG 1F    FIG 1G

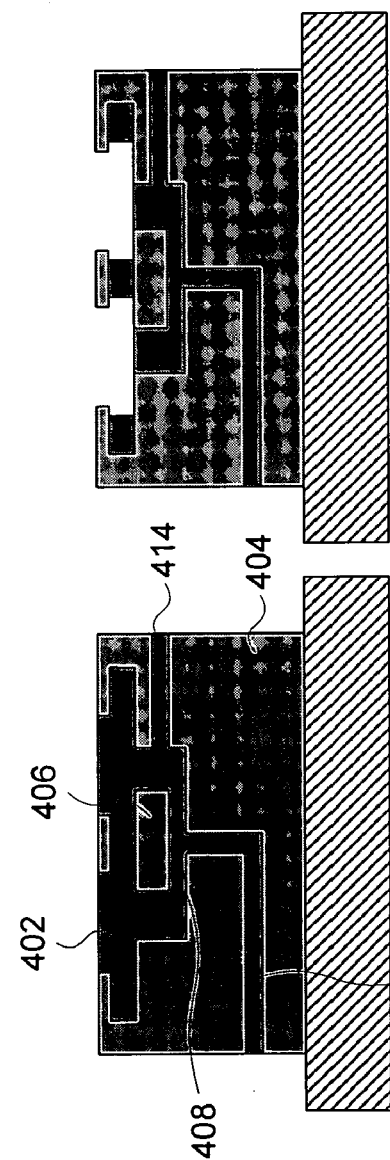
FIG 12A
FIG 12B
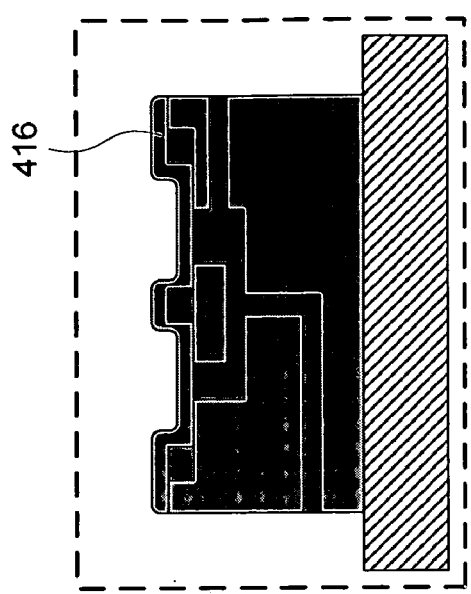
FIG 12C
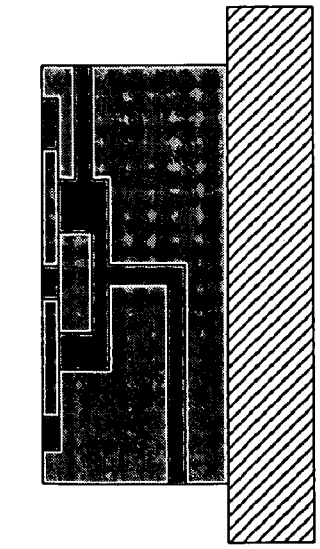
FIG 12D
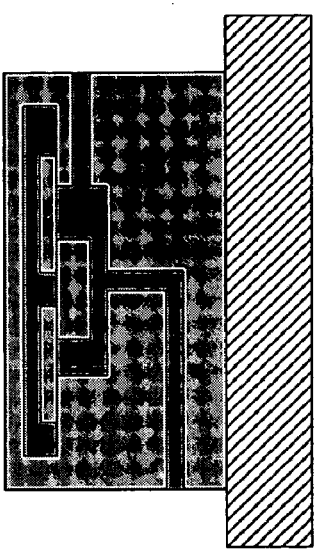
FIG 12E
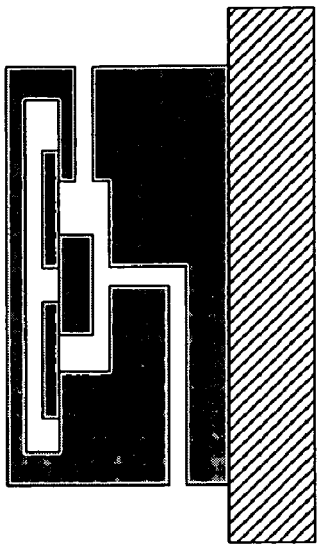
FIG 12F

COMPLEX MICRODEVICES AND APPARATUS AND METHODS FOR FABRICATING SUCH DEVICES

RELATED APPLICATIONS

This application is a continuation of U.S. Non-Provisional Patent Application No. 10/313,795 filed on Dec. 6, 2002 now U.S. Pat. No. 7,185,546 which in turn claims benefit to U.S. Provisional Patent Application Nos.: 60/364,261 filed on Mar. 13, 2002; 60/340,372 filed on Dec. 6, 2001; 60/379,133 filed on May 7, 2002; 60/415,371 filed on Oct. 1, 2002; 60/379,135 filed on May 7, 2002; 60/379,182 filed on May 7, 2002; 60/430,809 filed on Dec. 3, 2002; 60/379,184 filed on May 7, 2002; 60/415,374 25-A filed on Oct. 1, 2002; 60/392,531 filed on Jun. 27, 2002; 60/422,007 filed on Oct. 29, 2002; 60/422,982 filed on Nov. 1, 2002; 60/429,483 filed on Nov. 26, 2002; 60/429,484 filed on Nov. 26, 2002. Each of these applications is incorporated herein by reference as if set forth in full. U.S. patent application Ser. Nos. 60/379,177, filed on May 7, 2002, 60/379,130 filed on May 7, 2002, and 10/309,521, filed Dec. 3, 2002 are also incorporated herein by reference.

FIELD OF THE INVENTION

The present invention relates generally to the field of miniature devices while specific embodiments are directed to various sensors, various actuators, valves, structures possessing complex fluid flow paths, tooling, electrical devices, as well as other devices, apparatus for producing complex miniature devices, and methods for producing complex miniature devices. In some embodiments, fabrication of devices occur via Electrochemical Fabrication techniques that may involve the formation of a plurality of layers of material formed and adhered to one another via one or more of selective and/or blanket depositions (e.g. by electroplating), selective and/or blanket etching (e.g. by chemical or electrochemical processes), planarization and/or polishing, and/or other forms of deposition.

BACKGROUND OF THE INVENTION

A technique for forming three-dimensional structures/devices from a plurality of adhered layers was invented by Adam L. Cohen and is known as Electrochemical Fabrication. It is being commercially pursued by MEMGen™ Corporation of Burbank, Calif. under the tradename EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of MEMGen™ Corporation of Burbank, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

1. A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.
2. A. Cohen, G. Zhang, F. Tseng, F. Mansfeld, U. Frodis and P. Will; "EFAB: Rapid, Low-Cost Desktop Micromachining of High Aspect Ratio True 3-D MEMS", Proc. 12th IEEE Micro Electro Mechanical Systems Workshop, IEEE, p244, January 1999.
3. A. Cohen, "3-D Micromachining by Electrochemical Fabrication", Micromachine Devices, March 1999.
4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.
5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.
6. A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
8. A. Cohen, "Electrochemical Fabrication (EFABTM)", Chapter 19 of The MEMS Handbook, edited by Mohamed Gad-El-Hak, CRC Press, 2002.
9. "Microfabrication - Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that comprises a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e., structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, and/or more independence between geometric configuration and the selected fabrication process.

A need exists in the field of miniature device fabrication for improved fabrication methods and apparatus.

SUMMARY OF THE INVENTION

An object of various aspects of the invention is to provide devices (e.g. structures, objects, parts, components, and the like) having improved characteristics.

An object of various aspects of the invention is to provide reduced fabrication time for producing devices (e.g. prototype devices).

An object of various aspects of the invention is to provide reduced fabrication costs for producing devices (e.g. prototype devices)

An object of various aspects of the invention is to provide simplified fabrication processes for producing devices.

An object of various aspects of the invention is to provide more independence between geometric configuration of a device and the selected fabrication process.

A need exists in the field of miniature device fabrication for improved fabrication methods and/or apparatus.

Other objects and advantages of various aspects of the invention will be apparent to those of skill in the art upon review of the teachings herein. The various aspects of the invention, set forth explicitly herein or otherwise ascertained from the teachings herein, may address any one of the above objects alone or in combination, or alternatively may address some other object of the invention ascertained from the teachings herein. It is not intended that any specific aspect of the invention (that is explicitly set forth below or that is ascertained from the teachings herein) address any of the objects set forth above let alone address all of these objects simultaneously, while some aspects may address one or more of these objects or even all of these objects simultaneously.

In a first aspect of the invention a sensor includes at least two sets of capacitor plates wherein each set of plates includes a plurality of plates.

In a second aspect of the invention, an actuator includes at least two sets of capacitor plates wherein each set includes a plurality of plates and wherein a motion of the actuator is perpendicular to a plane of the plates.

In a third aspect of the invention, an actuator includes at least two sets of capacitor plates wherein each set includes a plurality of plates and wherein a motion of the actuator is in a direction parallel to a plane of the plates, and wherein a portion of the plurality of plates in one set are positioned in a first plane while another portion of the plurality of the plates of the one set are positioned in a second plane offset from the first plane.

In a fourth aspect of the invention, an actuator includes at least two sets of capacitor plates wherein each set includes a plurality of plates and wherein a motion of the actuator is in a direction parallel to a plane of the plates, and wherein the plurality of plates in one set are positioned in an array that extends in three dimensions.

In a variation of the first through fourth aspects of the invention, the sensor or actuator is formed at least in part via electrochemical fabrication.

In a fifth aspect of the invention an LVDT sensor is formed at least in part via electrochemical fabrication.

In a sixth aspect of the invention an actuator is formed at least in part via electrochemical fabrication.

In a seventh aspect of the invention a sensor is formed at least in part via electrochemical fabrication.

In an eighth aspect of the invention an electrostatic actuator includes at least one moveable member and at least one actuation electrode for causing movement of the moveable member wherein the electrode and/or the moveable member is configured to have a contour that leads to a spacing between moveable member and the electrode when the moveable member is in its deflected position toward the electrode which is more uniform than when the moveable member is in an undeflected position.

In a ninth aspect of the invention an electrostatic actuator includes at least one moveable member and at least one actuation electrode for causing movement of the moveable member wherein the electrode and/or the moveable member has a configuration that brings portions of the electrode and member closer together without significantly interfering with the movement of the member.

In a tenth aspect of the invention an electrostatic actuator includes at least one moveable member and at least one actuation electrode for causing movement of the moveable member wherein the electrode has at least one sidewall or at least one protrusion in a region that reduces the separation between the electrode and the member without hindering the motion of the member.

In an eleventh aspect of the invention an electrostatic actuator includes at least one moveable member and at least two actuation electrodes that can be activated to create forces that pull the moveable member in opposing directions.

In a twelfth aspect of the invention an electrostatically actuated micro-mirror scanning system includes contoured electrodes that allow a reduced drive voltage without hindering mirror movement.

In a thirteenth aspect of the invention a structure includes a multi-level micro flow channel.

In a fourteenth aspect of the invention a metal mold includes a plurality of levels having features with dimensions on the order of 10s of microns or less.

In a fifteenth aspect of the invention a process for forming a multilayer microdevice, comprising: (a) forming a layer of at least one material on a substrate that may include one or more previously deposited layers of one or more materials; (b) repeating the forming operation of "(a)" one or more times to form at least one subsequent layer on at least one previously formed layer to build up a three-dimensional structure from a plurality layers; wherein the forming of at least one layer, comprises: (1) supplying a substrate on which one or more successive depositions of one or more materials may have occurred; (2) supplying a mask having a desired pattern or capable of being activated to effectively deposit or etch a desired pattern of material; (3) bringing the mask and the substrate into contact or proximity such that electrochemical process pockets are formed having a desired registration with respect to any previous depositions and providing a desired electrolyte solution such that the solution is provided within the electrochemical process pockets; and (4) applying a desired electrical activation to cause a desired material to be deposited onto the substrate or removed from the substrate in preparation for deposition of a material onto the substrate; wherein the microdevice includes one or more of the following: an accelerometer, a switch, a valve, a 3-D tilt mirror, a fluid well, a tool for producing other microstructures or structures with micro-patterning, an actuator including a contoured electrode, a bellows controlled valve, an actuator with pull down and pull up electrodes, a valve comprising a shape memory device, a bistable valve, a device at least partly surrounded by a conductive shield wall.

In a sixteenth aspect of the invention a microdevice, includes: a plurality of layers of successively deposited material, wherein the deposition of each layer of material comprises, (a) deposition of at least a first material; and (b) deposition of at least a second material; and wherein at least a portion of the first or second material is removed after deposition of the plurality of layers; and wherein a structure resulting from the deposition and the removal provides at least one structure that can function as (1) an accelerometer, (2) a toroidal inductor, (3) a switch, (4) a valve, (5) a helical inductor, (6) a 3-D tilt mirror, (7) a fluid well, (8) an antenna, or (9) a mold.

In a seventeenth aspect of the invention a method of manufacturing a microdevice includes: depositing a plurality of adhered layers of material, wherein the deposition of each layer of material comprises, a. selective deposition of at least a first material; b deposition of at least a second material; and c. planarization of at least a portion of the deposited material; removing of at least a portion of the first or second material after deposition of the plurality of layers; wherein a structure resulting from the deposition and the removal provides at least one structure that can function as (1) an accelerometer, (2) a toroidal inductor, (3) a switch, (4) a valve, (5) a helical inductor, (6) a 3-D tilt mirror, (7) a fluid well, (8) an antenna, or (9) a mold.

In a eighteenth aspect of the invention a microaccelerometer includes: a proof mass; and at least one of a plurality of spring-like structures for supporting the proof mass relative to a substrate; where a portion of the plurality of spring-like structures attach to the proof mass below a center of mass of the proof mass and a plurality of the spring-like structures attach to the proof mass above the center of mass of the proof mass; or a plurality of spring-like structures for supporting the proof mass relative to a substrate; where a portion of the plurality of spring-like structures attach to the proof mass in a common plane that includes the center of mass of mass of the proof mass.

In a nineteenth aspect of the invention a microvalve that includes a valve seal and wherein at least one of the valve seat or valve seal is supported by at least one corrugated support structure.

In a twentieth aspect of the invention a 3-D tilt mirror including features with dimensions on the order of 10s of microns comprising a rotatable mirror structure with a reflective surface that is supported by at least one spring-like structure, wherein the spring-like structure is formed from the same material as that which forms the reflective surface.

Further aspects of the invention will be understood by those of skill in the art upon reviewing the teachings herein. Other aspects of the invention may involve combinations of the above noted aspects of the invention. Other aspects of the invention may involve apparatus that can be used in implementing one or more of the above method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 1A-1C schematically depict a side view of various stages of a CC mask plating process, while FIGS. 1D-G depict a side view of various stages of a CC mask plating process using a different type of CC mask.

FIGS. 12A-12F depicts various stages in a process for forming a valve according to an embodiment of the invention.

DETAILED DESCRIPTION OF PREFERRED EMBODIMENTS OF THE INVENTION

Figure 1A:
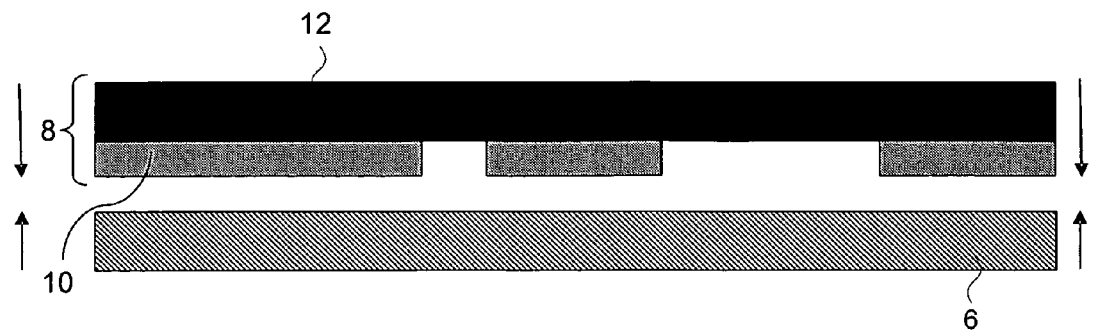
Figure 1B:
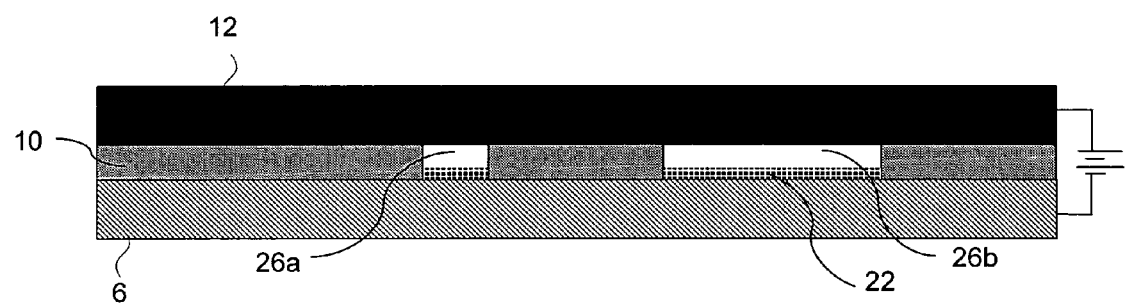
Figure 1C:
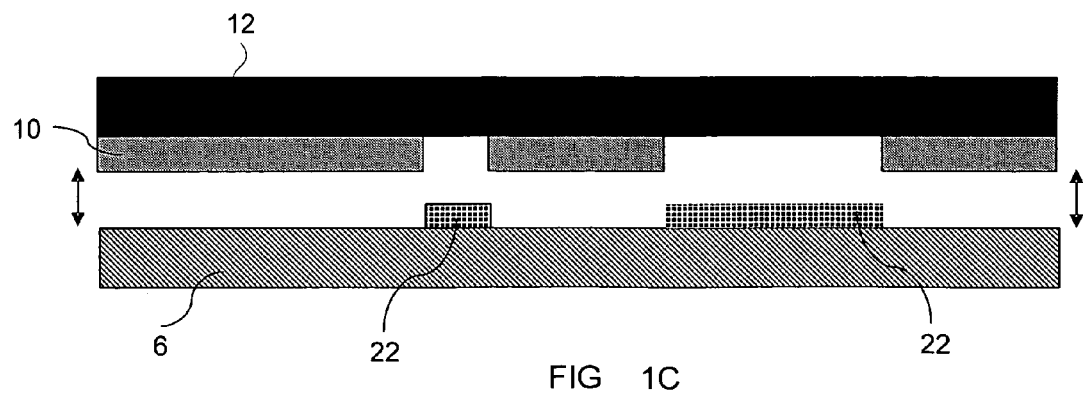

FIGS. 1A-1G, 2A-2F, and 3A-3C illustrate various features of Electrochemical Fabrication that are known. Other electrochemical fabrication techniques are set forth in the '630 patent referenced above, in the various previously incorporated publications, in patent applications incorporated herein by reference, still others may be derived from combinations of various approaches described in these publications, patents, and applications, or are otherwise known or ascertainable by those of skill in the art. All of these techniques may be combined with those of the present invention to yield enhanced embodiments.

Some embodiments present miniature sensors or actuators that may be formed totally or in part using Electrochemical Fabrication techniques. Some of these devices may be formed monolithically in an Electrochemical Fabrication process. Some of these devices make use of applied electric fields to cause motion. Some embodiments use parallel plate gap closing effects while others use comb drive type effects. Some devices make use of applied electric fields to detect motion. A change in distance between capacitor plates produces a change in capacitance which can be electrically measured). Devices that rely on electric field properties to cause or sense motion are sometimes termed "electrostatic devices" even though the electric fields supplied or detected may not be static. Electrostatic devices offer several advantages: (1) their use is simple as it is relatively easy to apply and measure voltages, (2) relatively simple geometries may be usable, (3) at the distance scales involved in miniature devices (e.g. meso-scale and microscale devices) electrostatic forces become significant enough to move and manipulate mechanisms, (4) electrostatic devices may be configured for low power consumption, (5) electrostatic devices can operate quickly, and (6) Electrostatic devices can be shielded from the influence of external fields while producing little electromagnetic interference themselves. The designation of devices as "electrostatic" does not imply that the electric field doesn't change or that only DC currents are involved, but rather that the physics of electric fields dominates over the physics of any induced magnetic fields.

In fact, electrostatic devices have been operated over a large frequency range (e.g. up to several kilohertz or more).

Electrostatic devices proposed or developed have typically suffered from some problems: (1) though electrostatic forces achieved have been sufficient for some applications, they have been inadequate for others; (2) high actuation voltages have typically been necessary, e.g. in excess of 100 volts, and/or (3) some devices have exhibited unpredictable behavior or stiction which may be the result of production of unintended electric fields. Some embodiments of electrostatic actuators and sensors to be discussed hereafter lessen the severity of some of these problems: (1) by producing higher forces at lower actuation voltages, and/or (2) by providing higher capacitance changes at a given displacement for capacitance sensing, (3) by providing higher conductivity material, as compared to silicon, which may help reduce unintended charging, reduce power consumption, and allow operation at higher frequencies.

EFAB enables numerous new electrostatic actuator embodiments that create greater electrostatic force. As greater electrostatic force typically translates into greater capacitance structures of these embodiments can be advantageously used in sensor applications as well.

Linear electrostatic actuators, such as comb drives, typically employ some form of parallel plate configuration, in which the gap spacing between plates is fixed, while the area of overlap between plates changes during actuation, typically resulting in a linear motion and a linear relationship between applied voltage and displacement. The main issues associated with linear electrostatic actuators actuation force vs. voltage and total displacement or throw. By far the most widely used linear electrostatic actuator is the comb drive actuator, in which a series of interdigitated finger shaped electrodes provide an attractive force. Comb drive actuators previously proposed or developed provided a 2D array of comb fingers. The actuation force may be maximized by increasing the number of fingers, reducing the gap between the fingers, and increasing the thickness or depth of the fingers. Comb drives produced by surface micromachining have gaps of typically 1 or 2 microns and thickness of 2 microns in large arrays of dozens or even hundreds of comb fingers. In order to further increase the force, high-aspect ratio processes have been used to create very deep comb fingers. For example, DRIE-based comb fingers greater than 100 microns in thickness have been created. Limitations of conventional high-aspect ratio processing generally have required an increased comb gap at greater etch depths which have somewhat reduced the advantages of using high aspect ratio structures. These high aspect ratio comb drive actuators are essentially tall, extruded 2D comb drive arrays.

According to certain embodiments of the present invention, 3D arrays of comb drives containing many more combs than possible in a 2D array may be fabricated. Furthermore, according to some of these embodiments, it is possible to produces such actuators without a gap width to structure thickness dependence as thickness may be increased by simply adding more layers. In these some of these embodiments (to be discussed further hereafter), more combs are created in a smaller cross-sectional area thus allowing greater forces to be generated at lower voltages. Alternatively, or additionally, supporting spring and framework can be designed to allow greater displacement and greater stability at higher operating voltages. In still other embodiments such actuators may be combined with dielectric stops and the like to inhibit shorting. In still further embodiments it is possible to configure actuators to provide rotary motions as opposed to linear motion. In still further embodiments comb drives may be configured to provided multi-directional motion.

Electrostatic actuators may also be designed using parallel plates that create a driving force that attracts selected plates to one another thereby causing a motion that changes a gap between adjacent plates as they move. Conversely, sensors may be formed that take advantage of the change in capacitance that results from separation of the plates changing (pressure sensors and accelerometers). These actuators typically produce higher forces than to comb drives but are nonlinear in their operation. Typically, these actuators are implemented by placing an electrode underneath a structure, the electrode then pulls the structure downwards. Most tilting mirror devices use some version of this principal.

Some embodiments of the present benefit from a greater flexibility in arrangement of the gap closing electrodes that may be achieved via three-dimensional structuring of the actuator that is allowed by a true multi-layer fabrication process (e.g. by the ability to use more than 5 to 10 layers). For example, in some embodiments electrodes may be placed above and below a device for bidirectional actuation. In other embodiments a stationary actuator can act in the middle of two moving members. In still other embodiments enhanced sensor may be provided such as 2-axis and 3-axis accelerometers. In still other embodiments, stacking of electrode plates may be used to obtain a greater measure of change for a given displacement as opposed to implementations where single pair of plates are used in detecting a displacement.

With gap closing actuators, the force is generally approximately proportional to the square of the gap distance. This can be a problem when a large range of motion is required. In the state-of-the-art, the electrodes are placed at a distance from the moving member, so that the moving member does not touch the electrode throughout its full range of motion. Unfortunately, this often requires the electrode to be placed at a substantial distance from the moving member, which drastically reduces the available force. It then becomes difficult to initiate motion in the moving member. As a result, tilt mirror devices for example typically require large operating voltages due to the large distance between the mirror and electrode. Furthermore, this conventional approach results in a very nonlinear actuator behavior, requiring use of complex control schemes to compensate for the increase in force as the gap closes. In fact as it is typical for the spring force to increase only linearly with displacement, a maximum point in displacement can occur where the attractive force exceeds the return force and snapping closure occurs.

In some embodiments of the present invention, electrode and or moving member configuration is modified so that the actuating electrode is close to the moving member but does not intersect the path of motion. In some embodiments the electrode is supplied with a stairstep configuration (e.g. the electrode is formed from a stack of layers whose structure approximates a curve under which a cantilever beam will bend. It is believed that such a configuration may provide a substantial increase in force (or allow a significant reduction in driving voltage) while maintaining a desired extent of motion. Alternatively, the stiffness of the return springs could be increased without an increase in drive voltage to change the mechanical resonance frequency of the member. In other embodiments the actuation electrode for a cantilever beam may not be positioned so that it is only located, for example, in a plane below the beam but instead it may be configured to be both below and to the sides (or at least approaching the sides) of the beam such that the distance between the beam and portions of electrode is dramatically decreased while still allowing full motion of the beam. In still other embodiments, the beam may be made to move in more than one direction using multiple electrodes. In other embodiments, the electrodes may be both underneath a moving member and located to an elevated position beyond the end of the moving member. For example, the electrodes that control the multi-directional movement of a scanning mirror may be located below their respective portions of the scanning mirror as well as at an elevated position beyond the lateral extents of the moving mirror surface. In still further embodiments, the electrodes may be partially contoured to bring its surface closer to a moving member in such away as not to hinder the required motion while the moving member itself includes surface level modifications (e.g. deviates from a planar configuration) to bring portions of its surface closer to that of the electrode. In still further embodiments, the electrode may contain no surface level modifications (e.g. it may remain planar) while the moving member contains surface level modifications.

In still further embodiments, closing gap actuators may be stacked in series to increase the total throw of the actuator. An example is shown on pages 56 and 57. A 3D volume of such electrodes could be used to construct an actuator 'fabric' with high displacement and force.

Multiple electrostatic actuators can be configured to achieve complex functionality, such as for use as multi-axis component alignment structures. In some embodiments, required electrical traces may be formed in an EFAB process on a dielectric along with the formation of the rest of the devices or structures. In other embodiments it is also possible with EFAB to embed the conductive lines inside an insulating matrix as part of the composition of the supporting structural member. This allows multiple signals to be routed within a mechanical structure with minimal impact on the design and performance of the structure.

Electrostatic micromotors may also be made practical according to some embodiments of the invention by allowing formation of motors with both top drive and bottom drive electrodes as opposed to the top drive or side drive electrodes previously proposed.

Figure 4:
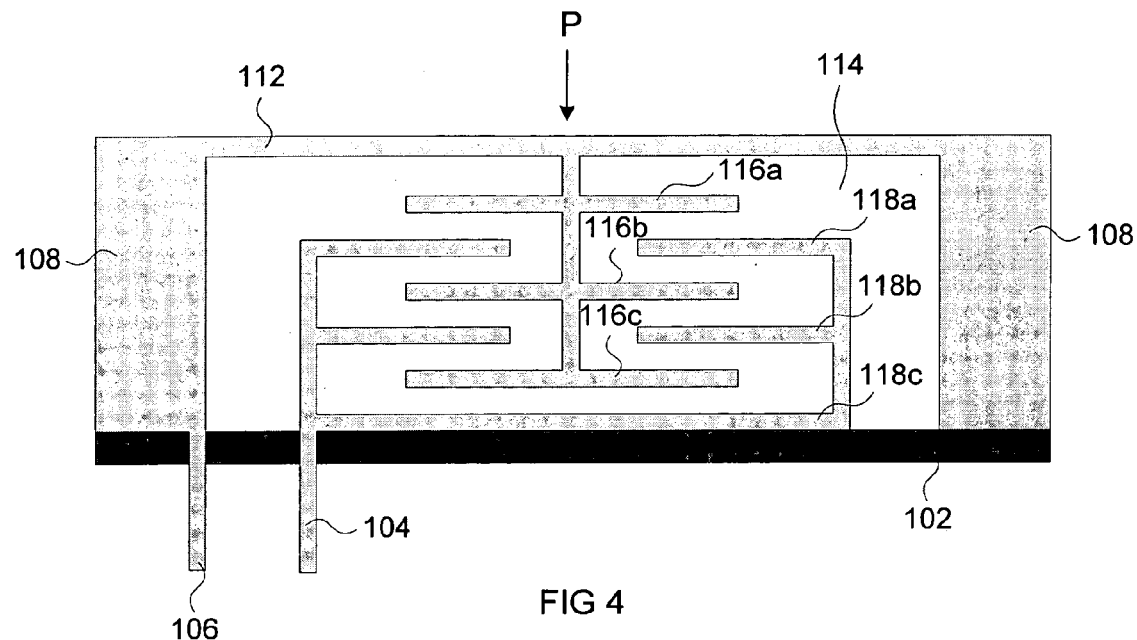
FIG. 4 illustrates a pressure sensor utilizing a plurality of stacked capacitor plates according to a first embodiment.

FIG. 4 illustrates a pressure sensor according to a first embodiment. This pressure sensor includes a plurality of stacked capacitor plates that may by used to enhance the sensitivity of any displacement caused by a pressure differential. The pressure sensor of the present embodiment includes a base plate 102 through which conductive leads 104 and 106 extend. Conductive lead 106 connects to walls 108 and flexible lid member 112 when a pressure P is exerted on the outside lid member 112 which exceeds a pressure P inside a chamber 114 formed by base 102 walls 108 and lid 112, a downward deflection of lid 112 occurs which causes a deflection of capacitive plates 116(a), 116(b) and 116(c) relative to capacitive plates 118(a), 118(b), and 118(c). This deflection causes a change in the capacitance of the capacitor that is formed by set of plates 116(a)-116(c) and 118(a)-118(c). This change in capacitance can be detected and correlated to a pressure differential. Due to the existence of multiple capacitor plates, the sensitivity of the sensor may be increased over that of a single set of or level of plates.

In alternative embodiments more then three pairs of capacitor plates may be used. In some embodiments a single pair of capacitor plates may suffice while in other embodiments many pairs of capacitor plates might be appropriate. In some embodiments the hermetic sealing techniques set forth in U.S. patent application Ser. No. 60/379,182 and in U.S. patent application Ser. No. 60/430,809 filed Dec. 4, 2002 having MEMGen Corporation Docket No. P-US021-B-MG may be used to form pressure sensors. In some alternative embodiments conductive leads 106 and 104 may extend from a wall of the sensor as opposed to through the base. In such alternative embodiments, if the walls form part of the conductive path that lead to a set of the capacitor plates, then the conductive lead for the other set of plates may be separated from the wall by a dielectric material where the dielectric material may be added to the structure after its formation or may be added to the structure during its formation such as during formation on a layer-by-layer basis by electrochemical fabrication. In still other embodiments the walls and the exposed surface of lid 112 may be of the dielectric material or a dielectric coated conductor. In still other embodiments fixed capacitor plates 118(a)-118(c) may be connected to a portion of the walls as opposed to being mounted on the base. In some embodiments the sensors may detect, for example, pressure, displacement, or function as enhanced-sensitivity accelerometers (assuming the lid 112 doesn't effective displacement significantly and that moveable plates 116(a)-116(c) have sufficient mass).

Figure 5:
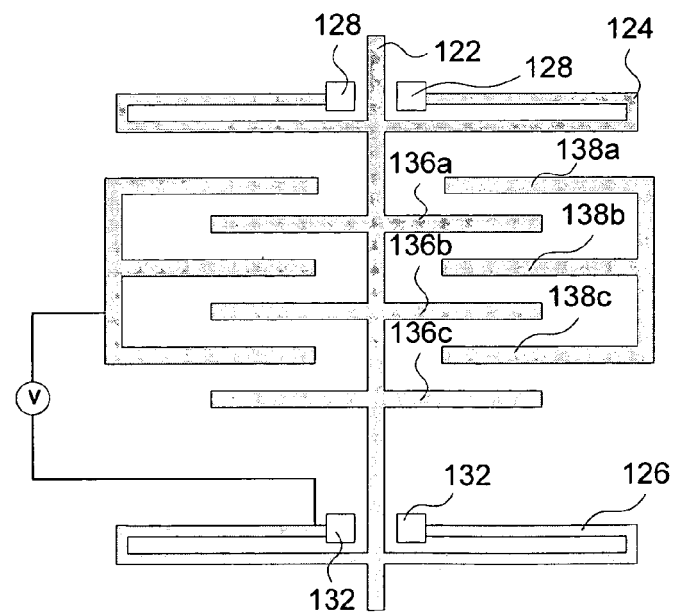
FIG. 5 illustrates an actuator utilizing a plurality of stacked capacitor plates according to a second embodiment.

A second embodiment is depicted in FIG. 5. As in the first embodiment, FIG. 5 depicts a side view relative to a plurality of layers from which the structure was formed. FIG. 5 depicts an actuator as opposed to the sensor of FIG. 4. The actuator consists of a shaft 122 that is connected to spring-like return arms 124 and 126 where the return arms are mounted in a fixed position at location 128 and 132. Connected to shaft 122 are capacitor plates 136(a)-136(c). A second set of capacitor plates 138(a)-138(c) are mounted to a frame (not shown) which may be the same frame to which portions 128 and 132 of return arms are directly or indirectly mounted. As a voltage V is applied between the two sets of capacitor plates, shaft 122 is displaced. Since the total force associated with the displacement of shaft 122 is related to the capacitance and since the capacitance is related to the effective area of the plates, by using multiple sets of plates a higher driving force can be obtained for a given cross-sectional area of individual plates. In some embodiments the actuator of FIG. 5 may be included in a housing in much the same manner as illustrated in FIG. 4, with the possible exception of an opening in a base or a lid such that the shaft may be coupled to an external element that is to be actuated. In alternative embodiments coupling between the shaft and an external component may occur via a non-physical link such as, for example, via capacitive, inductive, or magnetic coupling. In some embodiments a single pair of capacitive plates might suffice while in other embodiments many more sets of capacitor plates might be used. In still other embodiments sets of capacitive plates might be connected to different shafts and each of the shafts linked to a primary shaft such that the total force is increased still further. In some embodiments hundreds or even thousands of sets of plates may be used.

In the first and second embodiments the side views illustrated do not depict cross-sectional dimensions of the plates (along the dimension extending into the page). The plates may take on rectangular dimensions or circular dimensions or any other configuration that is appropriate to the constraints of a given application. The embodiment of FIG. 5 may be used to control, for example, a shutter mechanism in an optical application or a worm drive in an application where extended motion is required.

In some embodiments, the capacitor plates need not be planar and when used herein unless otherwise indicated indications of "parallel to", or "perpendicular to" capacitor plates should be interpreted as relative to a plane of a relevant portion of the surface of a plate or plates.

Figure 6A:
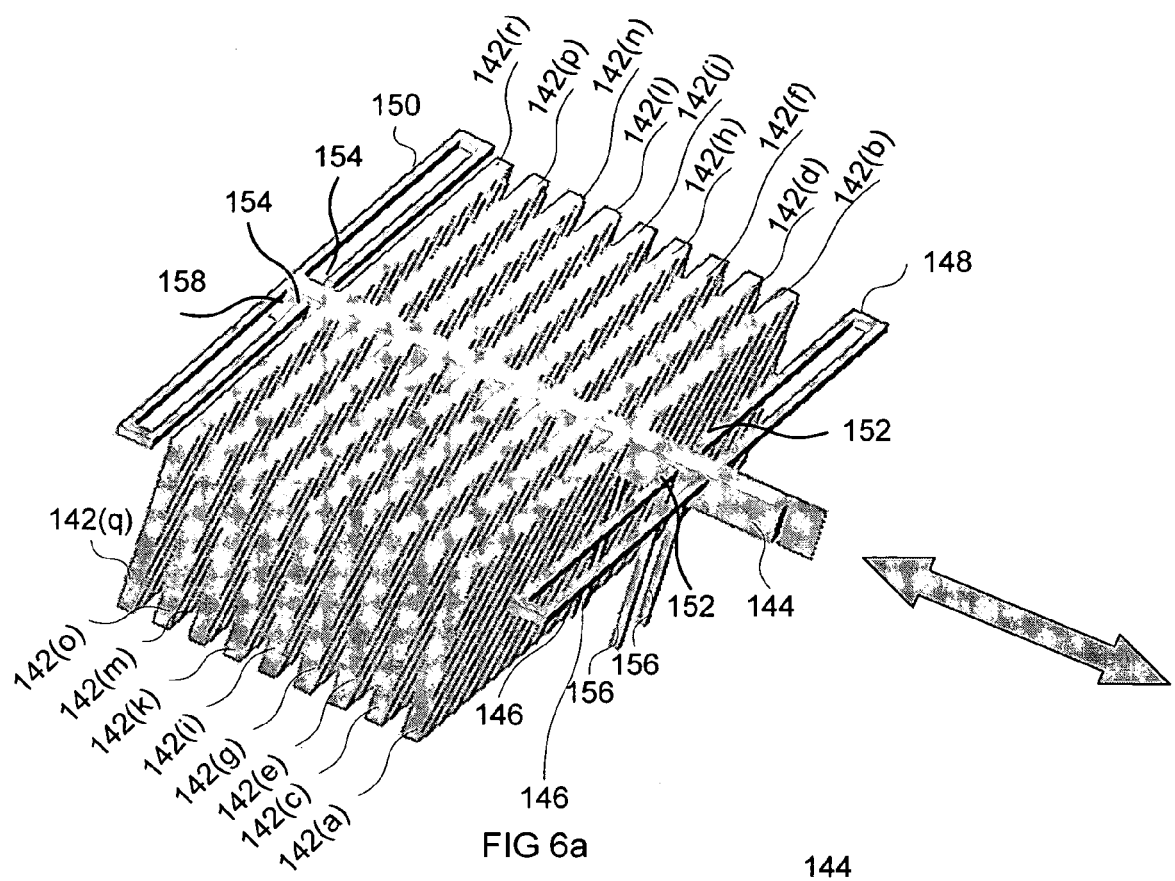
FIG. 6A illustrates a moveable portion of an actuator according to a third embodiment where the moveable portion includes a plurality of stacks and each stack includes a plurality of individual capacitor plates.
Figure 6B:
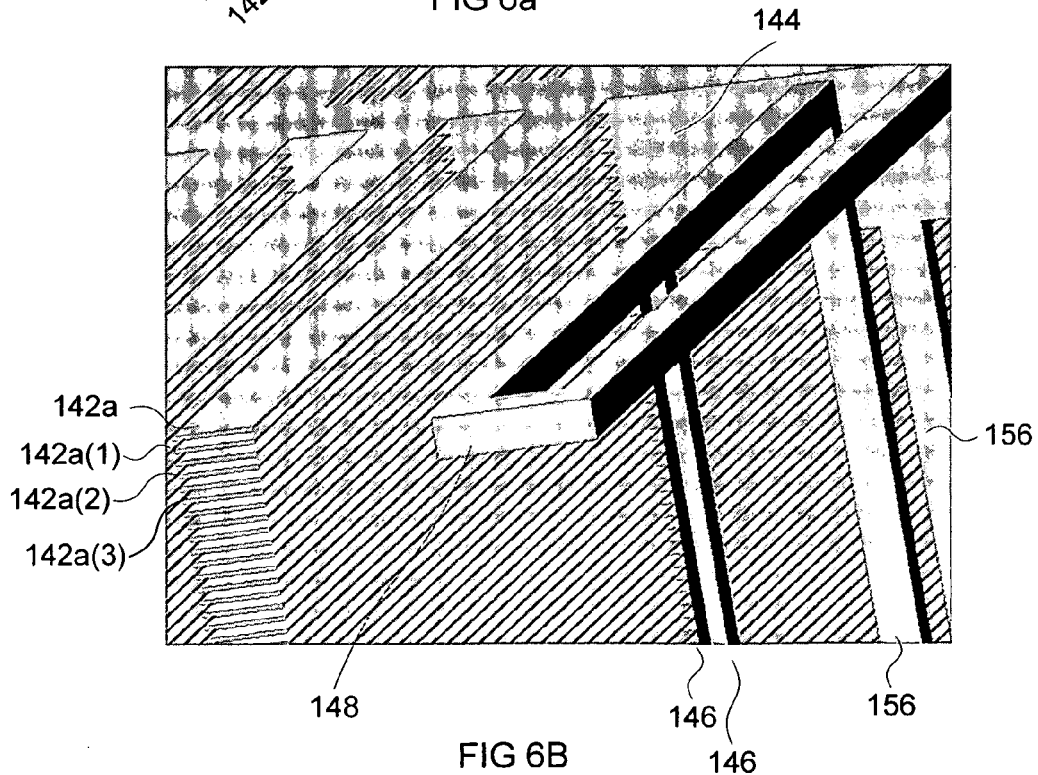
FIG. 6B illustrates an expanded view of a portion of FIG. 6A.
Figure 6C:
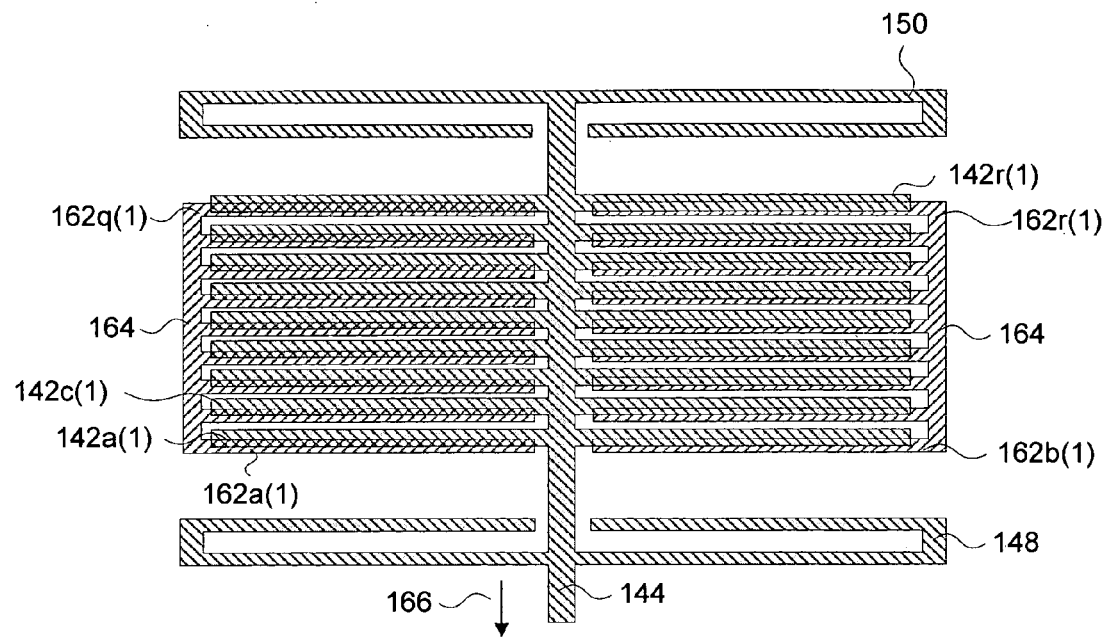
FIG. 6C illustrates a top view of the top level of partially overlapping fixed and moveable capacitor plates for the actuator of FIGS. 6A and 6B.

A third embodiment of the invention is depicted in FIGS. 6A-6C. FIG. 6A depicts a perspective view of the moving portion of an actuator while FIG. 6B depicts an expanded view of a portion of the structure of FIG. 6A such that individual capacitor plates can be seen in several of the stacks. FIG. 6C depicts a top view of both the moving elements and the fixed elements of the actuator of FIGS. 6A and 6B. The moving elements of actuator 6(a) include a plurality of stacks 142a-142r of capacitor plates where each stack itself includes a plurality of capacitor plates as illustrated in FIG. 6B as 142a(1), 142a(2), 142a(3), etc. The moving elements also include a shaft 144 and columns 146 that connect all of the capacitor plates into a single structure. Shaft 144 is supported by spring-like elements 148 and 150 which in turn have one end 152 and 154 connected to columns 156 and 158 that extend to a frame (not shown). For clarity of presentation FIGS. 6A and 6B do not depict the plurality of fixed capacitor plates that are interleaved partially between the moving capacitor plates 142a(1)-142a(3), etc and that would be supported by an appropriate structure relative to the support columns 156 and 158. The upper layer of movable capacitor plates 142a(1)-142r(1) are shown in FIG. 6C along with spring-like return arms 148 and 150 and shaft 144. FIG. 6C also depicts the upper level of fixed capacitor plates 162a(1)-162r(1). Fixed capacitor plates 162a(1)-162r(1) are connected to a frame (not shown) via connecting element 164. As a voltage is applied between the moving plates and the fixed plates, the plates are drawn into a tighter overlapping position thereby making shaft 144 move in direction 166. As with the embodiments of FIG. 4 and 5 the embodiments of FIG. 6 can take on numerous alternative configurations. For example the actuator of FIGS. 6A-6C may by enclosed in a housing. In some embodiments, the return elements may take forms different from those shown. In other embodiments, for example, the number of stacks of capacitor plates may be reduced to one or extended to many times the number depicted and likewise the number of capacitor plates on any given stack may be decreased to one or increased well beyond the number illustrated. In still other embodiments instead of driving the structure of FIGS. 6A-6C by applying a voltage of the desired magnitude, the structure may be used as a sensor whereas a displacement of shaft 144 may give rise to a change in capacitance which can in turn give rise to a detectable electrical signal which can be correlated to the displaced amount.

Figure 7:
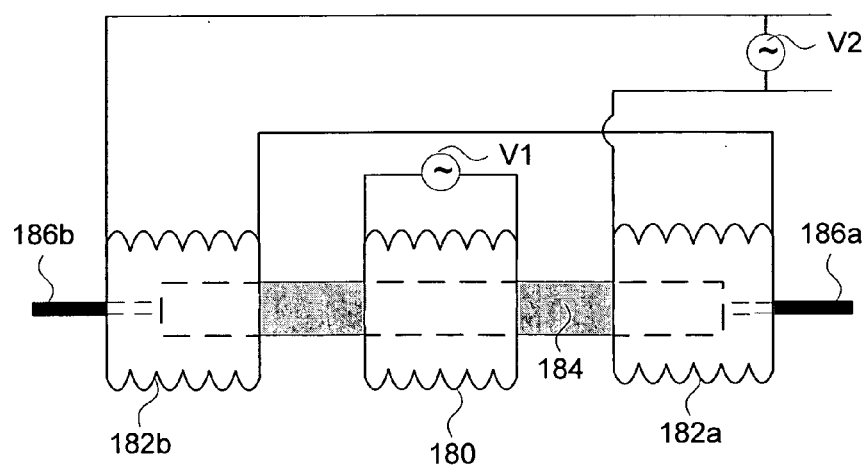
FIG. 7 illustrates a schematic representation of a linear variable differential transformer (LVDT).

A fourth embodiment of the present invention provides a linear variable differential transformer or LVDT which may be monolithically produced by electrochemical fabrication. As indicated in FIG. 7, the LVDT may consist of a primary transformer coil 180 and two secondary transformer coils 182a and 182b. Additionally, an armature of magnetically permeable material is included that may move back and forth such that different amounts of the armature may be located in secondary coils 182a or 182b. Armature 184 may have a non-magnetically permeable extension extending out of one or both ends of the secondary coils as indicated by reference numbers 186a and 186b. In use, the LVDT may be supplied with a voltage V1 on primary coils 180 and a voltage difference V2 between the two secondary coils may be detected, to yield a value which can be related to the position of armature 184. Armature 184 is connected via elements 186a or 186b to a structure whose position is to be measured. The detected voltage V2 may be used to determine the position of the desired structure. Using electrochemical fabrication windings of coils 180, 182a and 182b may be formed out of a first material such as copper while armature 184 may be formed out of a material such a permalloy. Elements 186a and 186b may be formed out of a suitable conductive or dielectric materials. An insulating material may be formed between the conductive elements 180, 182a, and 182b. Each of these materials as well as a sacrificial material (and any other needed materials) may be deposited (e.g. via electrochemical fabrication) on a layer-by-layer basis until a plurality of layers have been deposited to complete formation of the structure. As with the other embodiments numerous alternatives are possible. For example, the openings through coils 180, 182a, and 182b may be circular or rectangular in shape while armature 184 may take on a corresponding shape or other shape. The sensor of FIG. 7 may also be formed in a protective housing that may also be formed via electrochemical fabrication.

In some embodiments of the present invention the structures and devices formed may have features as small as a micron, or potentially even smaller, or as large as 10s or even 100s of microns or even larger.

In some alternative embodiments, the sensors and actuators may use alternatively shaped electrodes and actuation plates as discussed herein above and as illustrated in some embodiments to be discussed herein after.

Figure 8A:
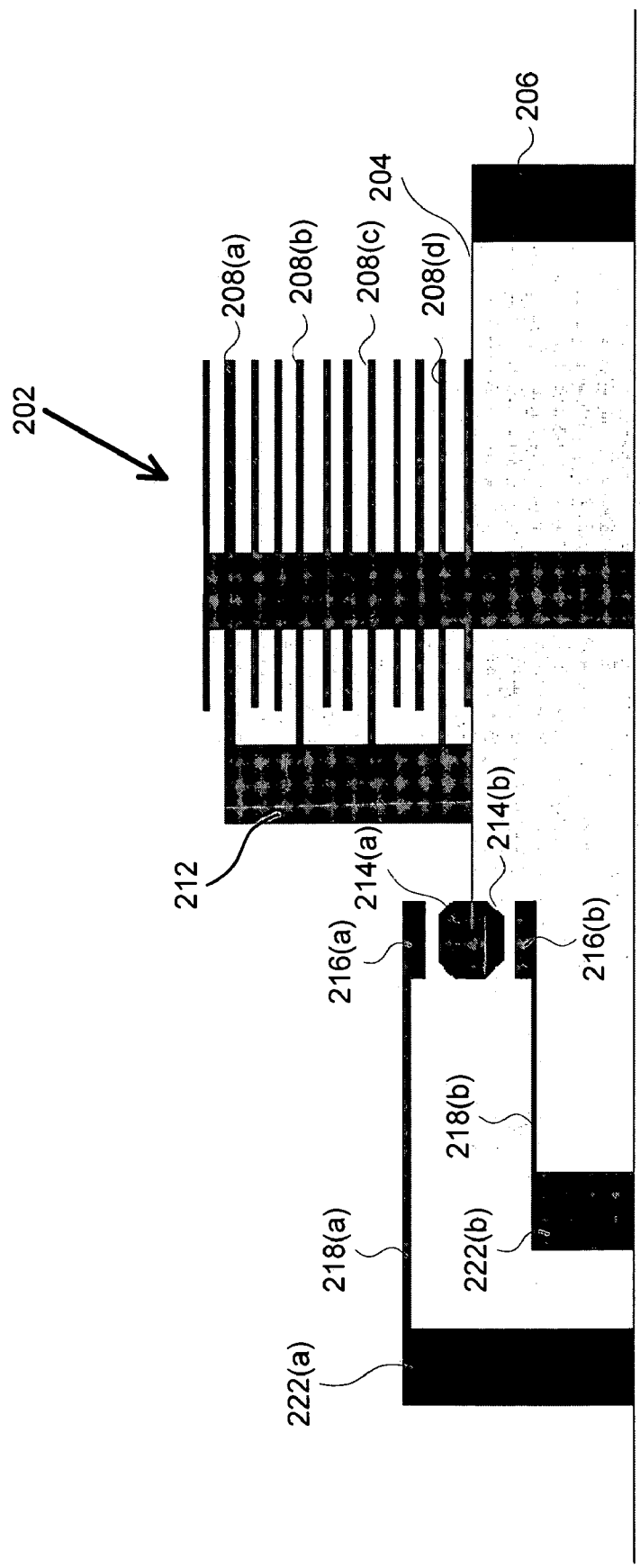
FIGS. 8A-8D depict various views of a switch according to an embodiment of the invention.
Figure 8B:
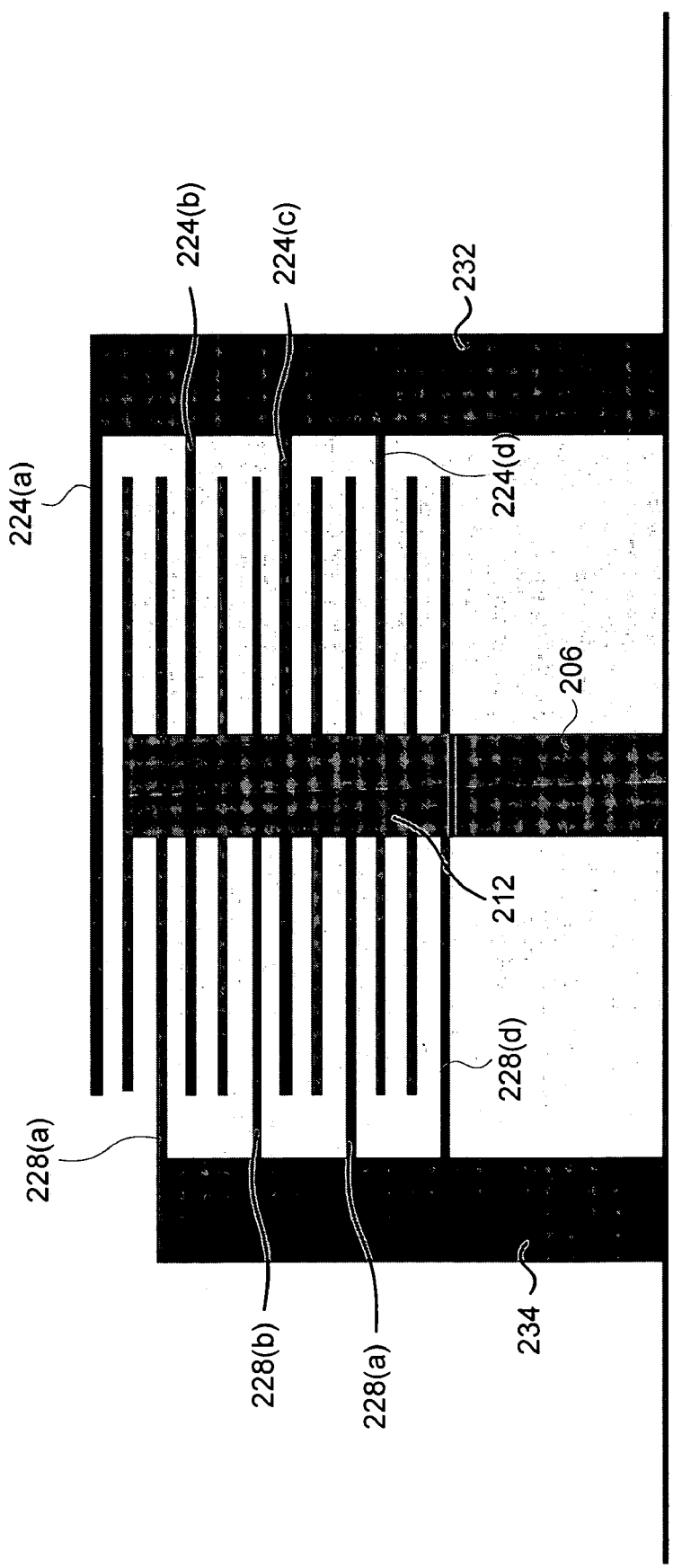
Figure 8C:
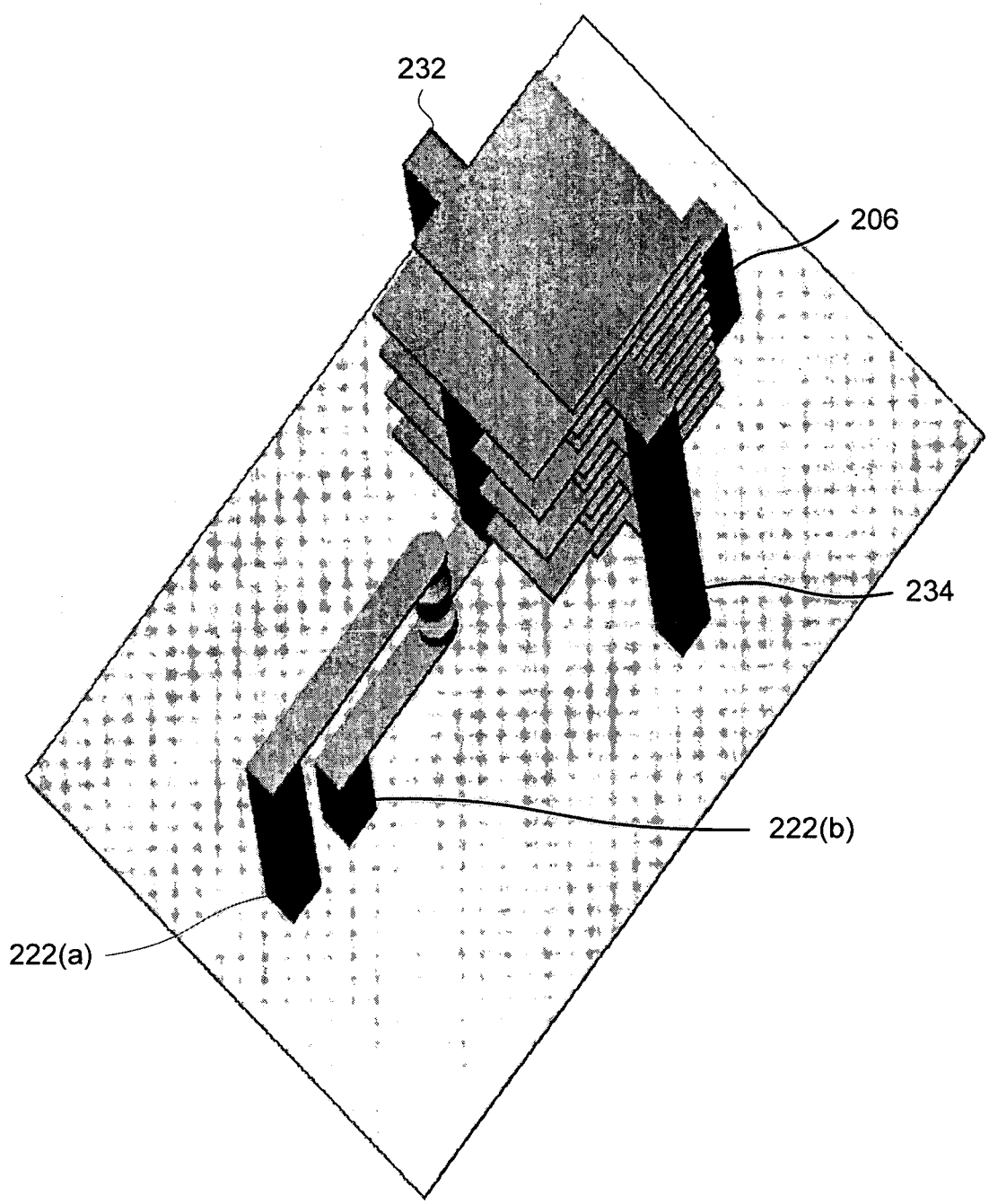
Figure 8D:
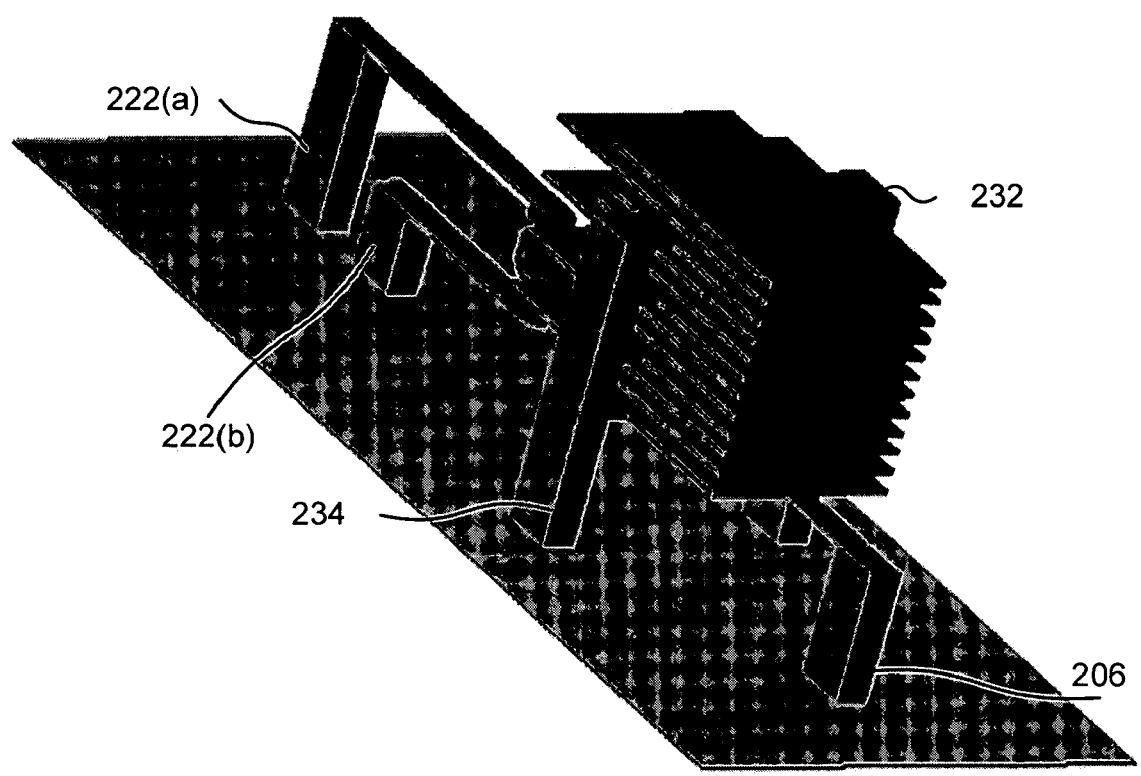

Another embodiment of the instant invention is depicted in FIGS. 8A-8D. This embodiment is directed to a single pole double through SPDT switch 202 whose moveable contact arm 204 is connected to a substrate via pedestal 206. A plurality of plates 208(a)-208(d) via vertical extending are connected element to 212. The moving member ends with contact element 214(a) and 214(b) located between two poles 216(a) and 216(b). These poles are supported by arms 218(a) and 218(b), respectively, which in turn are connected to a base by pedestals 222(a) and 222(b) respectively. The embodiment includes additional actuator plates. A first set of which includes plates 224(a)-224(d) that are used to pull moving member 204 upward and thus are used to cause contact element 214(a) to close with contact element 216(a). Another set of actuation plates 228(a)-228(d) are used to pull moving member 204 downward and thus to cause contact element 214(b) to close with pole 216(b). Plates 228(a)-228(d) are supported by vertical element 234 while plates 244(a)-224(d) are supported by vertical element 232. A switch of this type may be used to switch a signal between 3 states: (1) The open state—no contact between 214(b) and 216(b) and no contact between 214(a) and 216(a), (2) Closed state No. 1 where a signal is carried between elements 206 and 222(b) via contact between 214(b) and 216(b), (3) Closed state No. 2 where a signal is carried between elements 206 and 222(a) via contact between elements 214(a) and 216(a). While FIG. 8A depicts a side view, FIG. 8B depicts a back view and FIGS. 8C and 8D depict perspective views.

In alternative embodiments many variations of the design are possible. For example different numbers or sizes of plates may be used, different element dimensions are possible, the contact materials of elements 214(a), 214(b), 216(a) and 216(b) maybe different from the material of moving member 204 and arms 218(a) and 218(b). In still other embodiments, actuation voltages may be isolated from signals via independent lines that are separated by dielectrics. In still further embodiments contact elements 216(a) and 216(b) need not be located at the ends of flexible arm elements but instead may be rigidly mounted on pedestals or the like.

As illustrated in the FIGS. 8A-8D the elements of the switch are elevated above the substrate to reduce capacitance. In alternative embodiments, the switch elements may be mounted to a substrate. Multiple switch configurations are possible, including multipole and multi throw switches. Multiple switches may be configured in parallel for greater current handling and reliability, or in series. The contact geometry can be modified. A wide range of actuators may be used. Many different suitable electrostatic actuator designs are possible. In other embodiments, actuation may be implemented in other ways including magnetic, thermal, pneumatic, bimetallic, acoustic, piezoelectric schemes. These switches may operate at DC or RF frequencies. Switches which do not require physical contact, such as those based on capacitive coupling whether in series or shunt configuration for example, are possible. Stops may be used to prevent shorting in the case of capacitive switches, or spring brakes may be used to reduce the impact force immediately prior to closure to improve reliability and eliminate bounce.

Figure 9A:
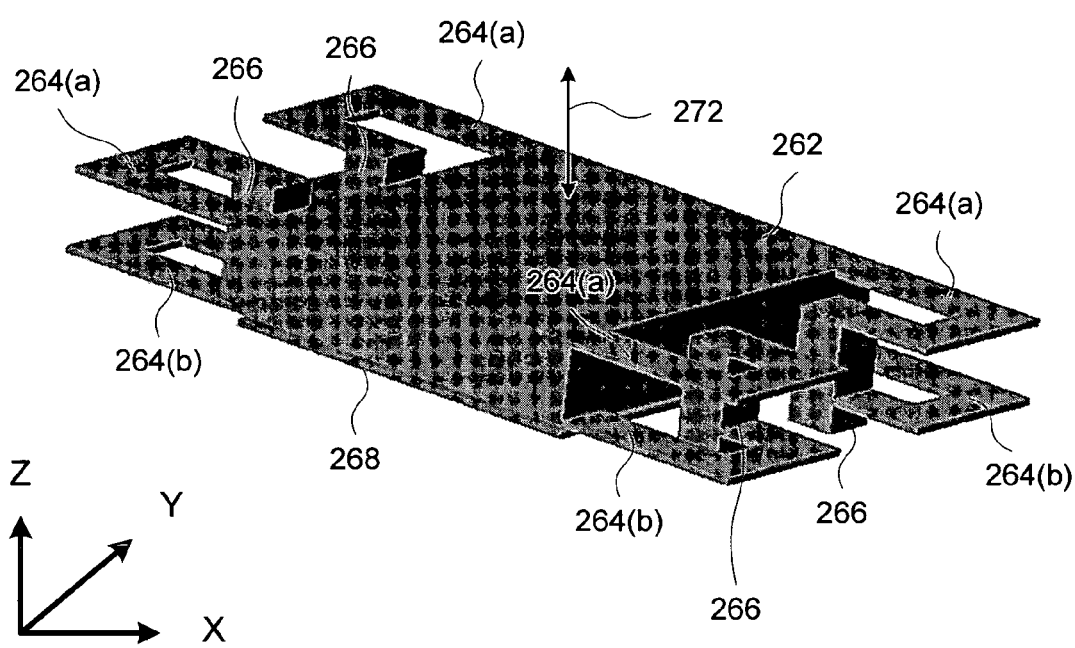
FIG. 9A illustrates the mechanical portion of an accelerometer which includes a proof mass supported by eight arms.

Another embodiment of the invention is illustrated on FIG. 9A. FIG. 9A illustrates the mechanical portion of an accelerometer which includes a proof mass 262 supported by eight arms, four of which are labeled with reference numeral 264(a) and three of which are labeled 264(b) while the eighth arm is invisible in this perspective view. Each pair of arms in connected to a support column 266 which in turn rests on a base not shown. Below the proof mass a plate 268 is shown, the proof mass and the plate 268 function as a capacitor of variable capacitance. The capacitance varies as accelerations in direction 272 cause relative displacements of the proof mass and the plate 268. In the illustrated design spring supports 264(a) and 264(b) are located above and below the center of mass of proof mass 262. In alternative embodiments a single set of spring supports may have been located at the level of the center of the mass or at a different level. In still other embodiments a different number of spring supports are possible. In still other embodiments the capacitance plate 268 may be suspended above a substrate so as to reduce parasitic capacitance. And in still other embodiments shorting between the plate 268 and proof mass 262 may be avoided completely or at least minimized by including posts, tabs, stops or other motion limiters that are made of dielectric materials and located between the plate and the mask. Alternatively, motion limiters may be made of conductive material that is mounted to the substrate and that extends between the mass and the plate but does not make electrical contact with the plate.

Figure 9B:
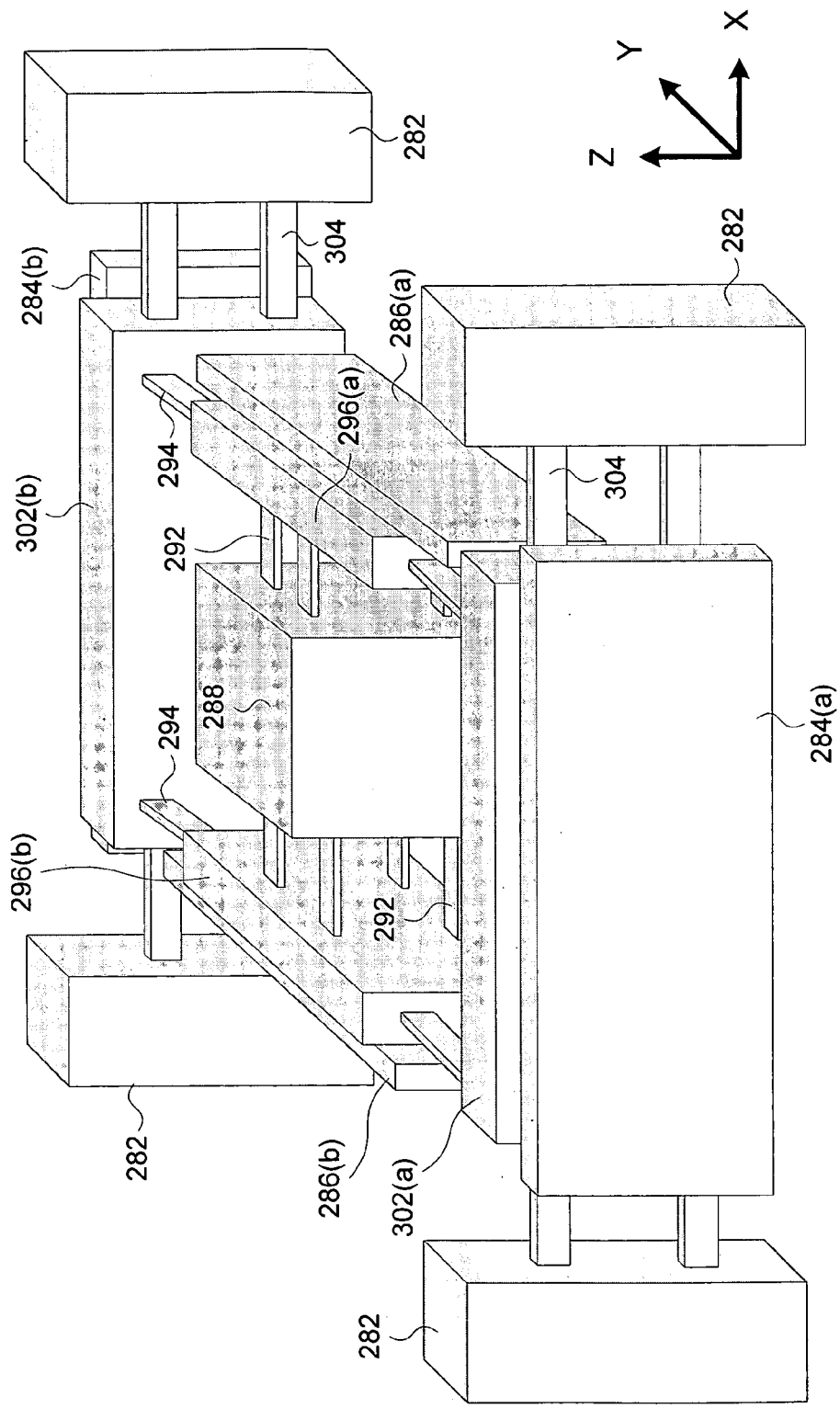
FIG. 9B illustrates a three-dimensional version of an accelerometer that can be fabricated using electrochemical fabrication.

FIG. 9B illustrates a three dimensional version of an accelerometer that can be fabricated using electrochemical fabrication. In this embodiment, posts 282 and capacitor plates 284(a) and (b) and 286(a) and (b) as well as a plate located above proof mass 288 and below proof mass 288 (plates not shown) are fixedly to a substrate. Springs 292 allow the proof mass to move in the vertical direction when an acceleration occurs in that direction. Such movement changes the capacitance between the proof mass and the plates thus allowing detection of the vertical acceleration. Springs 294 allow the proof mass to move in the X direction (it is noted that springs 292 are inflexible in that direction). The movement of the proof mass in the X direction can change the capacitance between capacitor plates 286(a) and 286(b) and frame elements 296(a) and 296(b), respectively allowing the capacitance to change, thus allowing detection of acceleration in the X direction. Similarly acceleration in the Y direction can be detected by changing capacitance between frame elements 302(a) and 302(b) and capacitor plates 284(a) and 284(b), respectively. This movement is allowed by springs 304. It should be noted that springs 292 and 294 are substantially inflexible in the Y direction. The capacitance change between elements 302(a) and 284(a) and 302(b) and 284(b) can be detected thus allowing detection of acceleration in the Y direction. In other embodiments other accelerometer configurations are possible.

Figure 10:
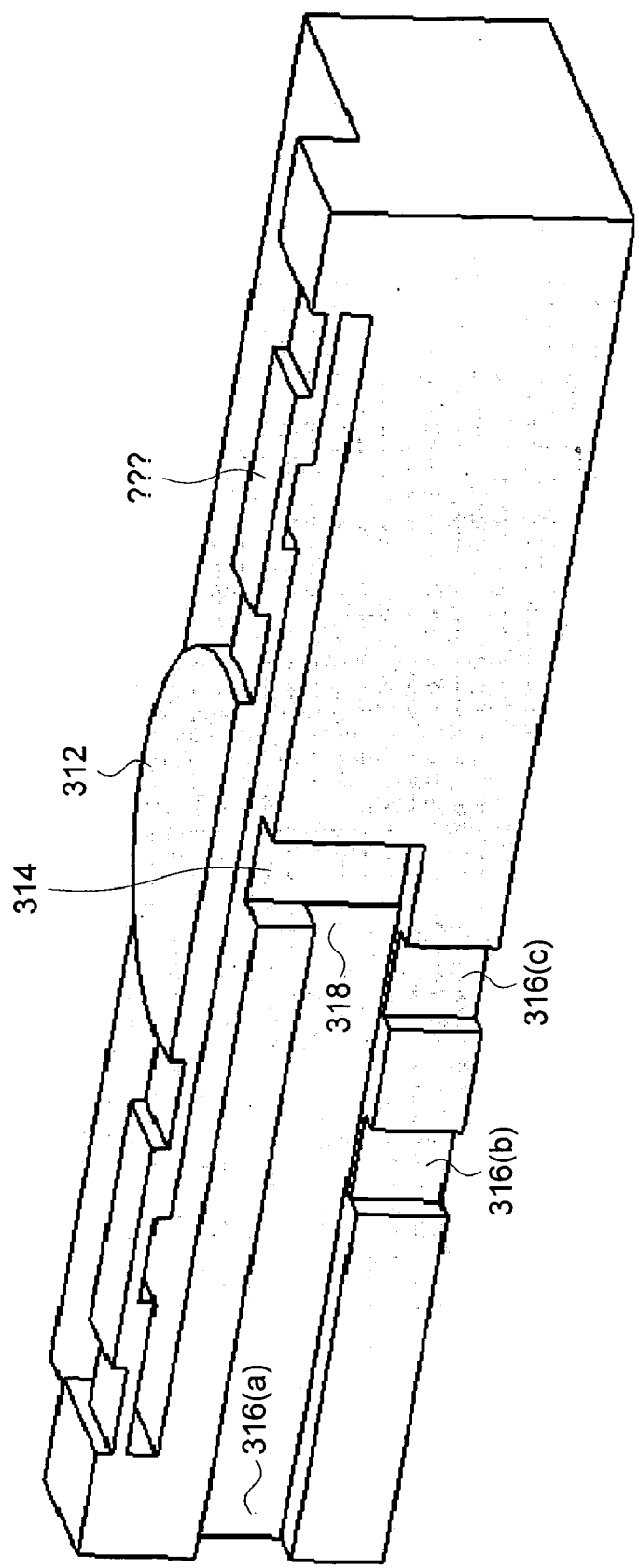
FIG. 10 illustrates another embodiment of the present invention where a check valve is provided.

FIG. 10 illustrates another embodiment of the present invention where a check valve is provided. The figure illustrates a perspective view of one half of the check valve (the front half of the check valve being removed so that the internal passages extending through the valve can be seen). The valve includes valve plate 312 located over an opening 314 which is at the end of passages 316(a), 316(b) and 316(c). Valve plate 312 is supported by a corrugated support bar or spring which allows the valve plate or diaphragm to seal against the valve seat that surrounds opening 314. Openings 316(a)-316(c) allow three different fluids to enter channel 318 and mix before exiting opening 314 when valve plate 312 is unseated due to pressure in chamber 318 exceeding the pressure above plate 312. In FIG. 10 the valve plate is shown separated from the seat surrounding opening 314 for illustrative purposes. In some embodiments the valve may be normally closed so that it is opened by an excess pressure in chamber 318. In other embodiments the valve may be normally open where some elevated pressure above plate 312 is required to close the valve.

Figure 11:
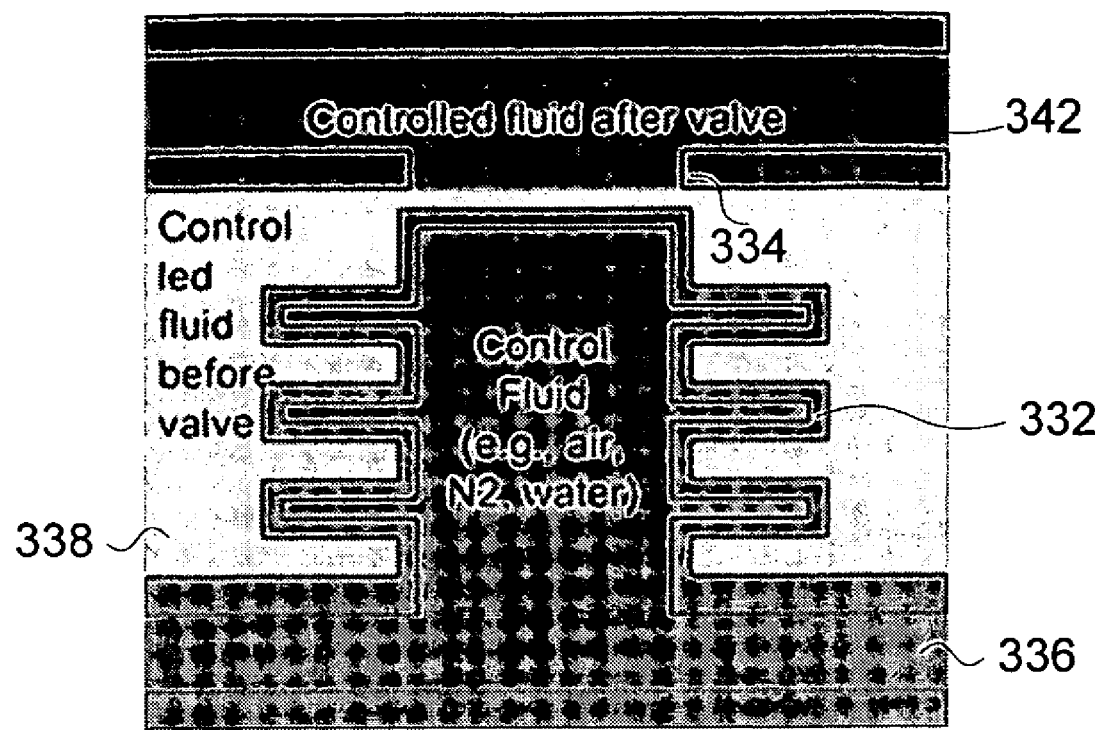
FIG. 11 depicts a pressure controlled bellows valve that can be made using electrochemical fabrication.

Though a check valve is illustrated in FIG. 10, a wide range of microfluidic devices are possible, including various pumps and valves. As an example of another fluid control device, FIG. 11, depicts a pressure controlled bellows valve that can be made using electrochemical fabrication. Application of positive and negative relative hydraulic or pneumatic pressure to the bellows 332 via channel 336 can cause the bellows 332 to seal against valve seat 334 to block fluid flow between chamber 338 and channel 342

A further example of a manufacturing process for a valve is illustrated in FIGS. 12A-12F. The valve illustrated in these figures is capable of proportional flow. In FIG. 12A, the valve has been fabricated partway using an electrochemical fabrication process of selective depositions, blanket depositions and planarization operations. FIG. 12A depicts the block of material as including a selective patterning of a sacrificial material 402 and a structural material 404. The embedded valve is shown as having a poppet 406, a valve seat 408, an inlet channel 412 and an outlet channel 414. FIG. 12B depicts that a portion of the sacrificial material 402 has been etched away using the top layer of structural material 404 as a temporary masking layer. In FIG. 12C the temporary masking layer has been planarized away and a layer of shape memory alloy 416 (SMA, e.g., nickel-titanium) has been deposited (e.g., by removing the substrate from the EFAB system and placing in a sputtering chamber). In FIG. 1D, the structure has been planarized, creating a layer that contains structural material 404, sacrificial material 402, and SMA 416. The pattern of the SMA material is defined by the apertures that were in the temporary masking layer and the resulting partial etch of sacrificial material illustrated in FIG. 12B and was selected to form bendable supports for the poppet 406 of structural material. It should be noted that these supports only occupy a portion of the gap between poppet and surrounding material (they do not form a continuous membrane). One result of this is that the upper and lower volumes of sacrificial material are interconnected to allow for etching of the upper volume. FIG. 12E illustrate that additional electrochemical fabrication steps have been performed to form a cap of structural material. Finally, in FIG. 12F the sacrificial material has been etched, forming fluid channels and cavities and freeing the SMA supports to move the poppet against the valve seat. The valve may be prepared for use by applying a force to the poppet (e.g., by deforming the cap so as to provide a springy membrane that pushes the poppet down) so as to preload the poppet against the valve seat, causing the valve to close and the SMA material to be deformed from its as-fabricated state. By heating the SMA supports (e.g., by heating the valve overall, or passing current through the SMA material), the SMA material will return to its original state, opening the valve. Proportional action may be obtained by controlling the amount of heating: a small amount of heating will open the valve only slightly, while a large amount will open it fully. It is noted that the inlet and outlet ports can be reversed from what is shown. In other embodiments shape memory alloys may be used in the formation cause biasing of various types of components. In still other embodiments the halting of electrochemical fabrication operations may be performed for the purpose of performing other operations that etching and SMA deposition.

In other embodiments, other valves of similar design can be achieved by replacing the SMA supports in the valve described above with other actuators including thermal actuators (e.g., thermal bimorph, heatuator (a loop with segments having non-uniform cross-sectional area), piezoelectric actuators, and so forth.

Figure 2A:
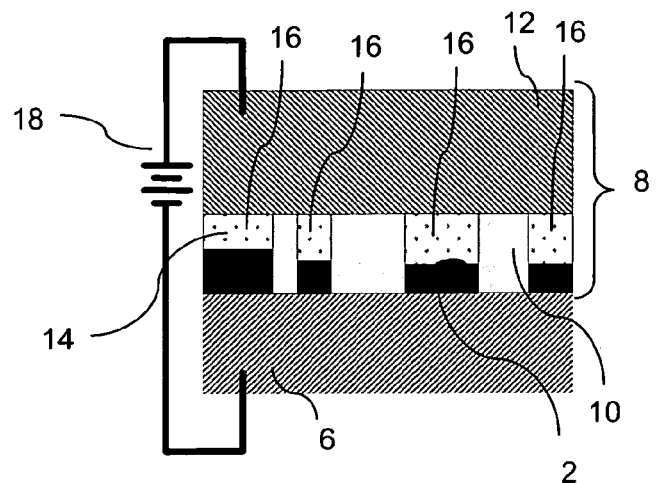
FIGS. 2A-2F schematically depict side views of various stages of an electrochemical fabrication process as applied to the formation of a particular structure where a sacrificial material is selectively deposited while a structural material is blanket deposited.
Figure 2B:
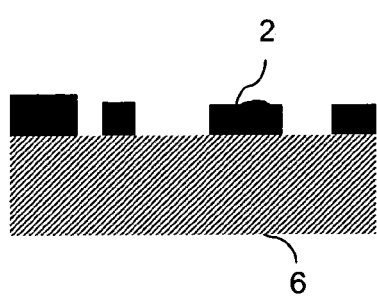
Figure 2C:
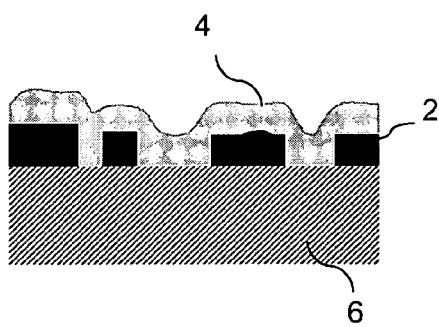
Figure 2D:
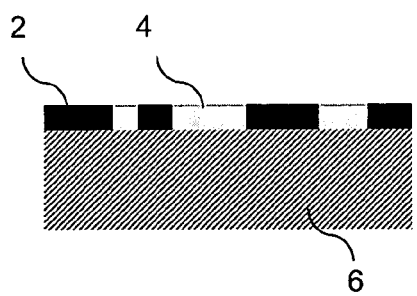
Figure 2E:
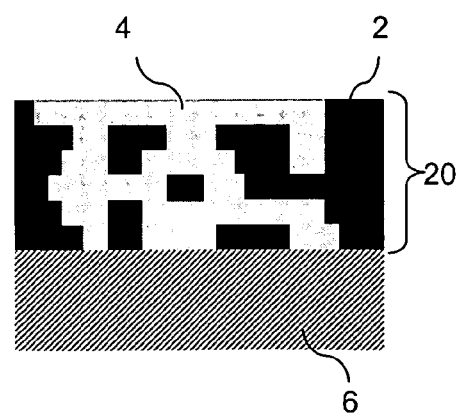
Figure 2F:
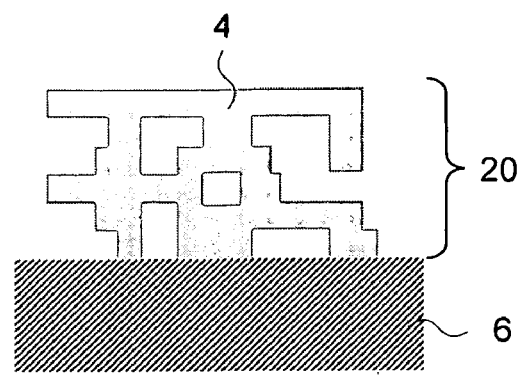
Figure 3A:
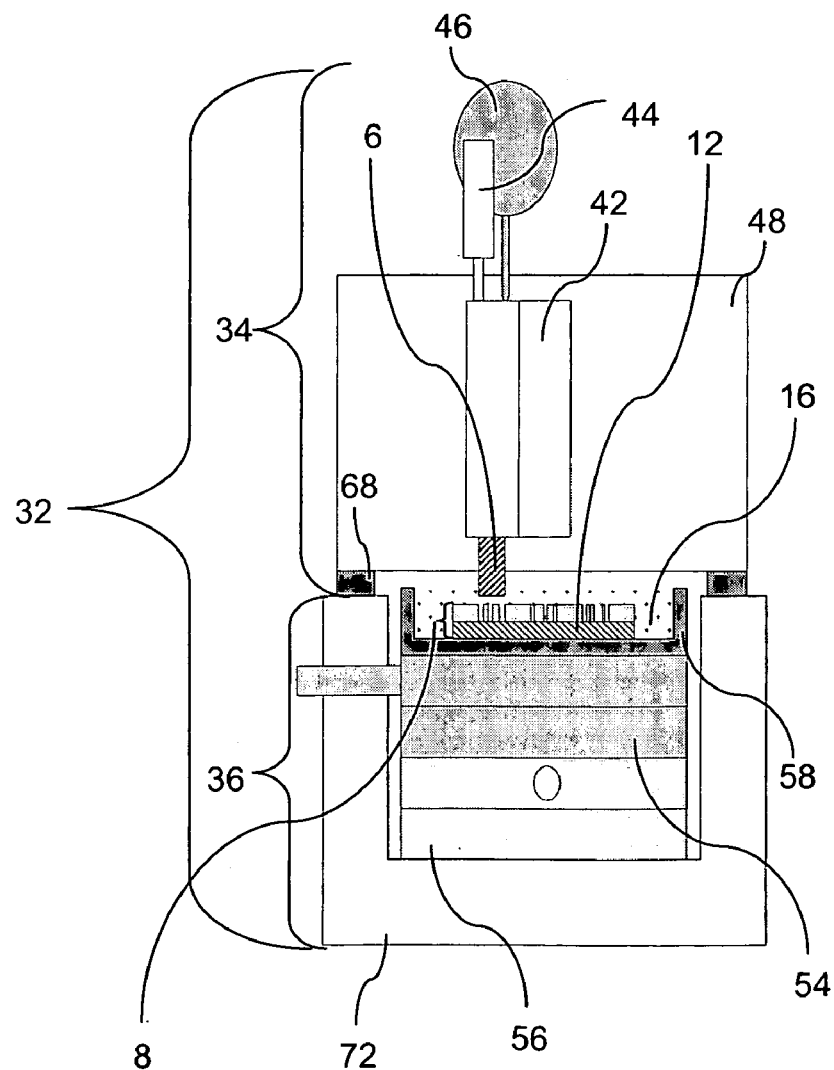
FIGS. 3A-3C schematically depict side views of various example subassemblies that may be used in manually implementing the electrochemical fabrication method depicted in FIGS. 2A-2F.
Figure 3B:
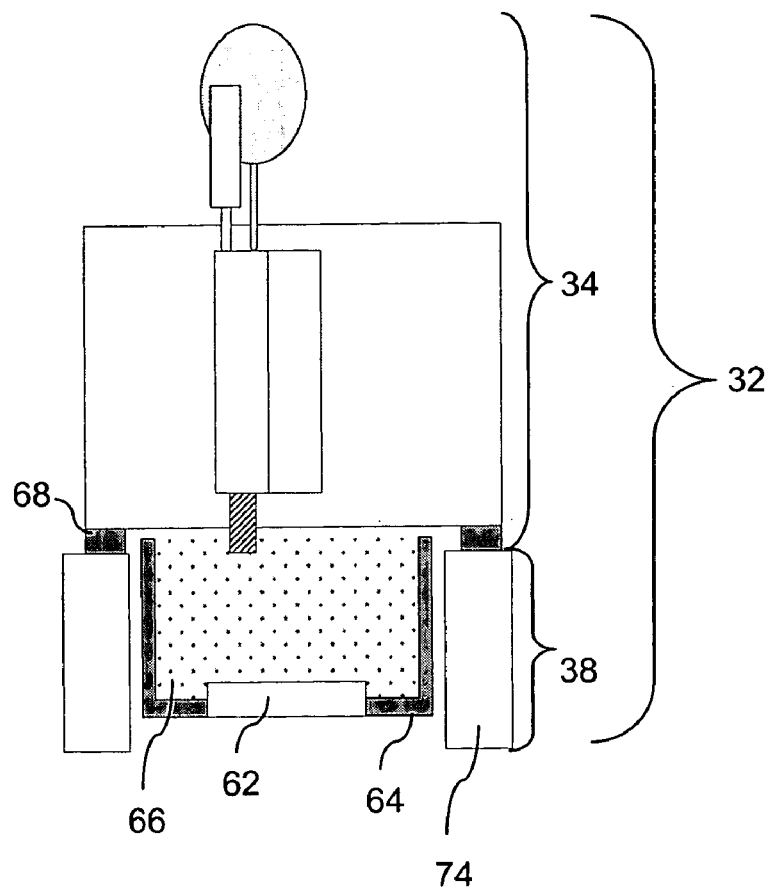
Figure 3C:
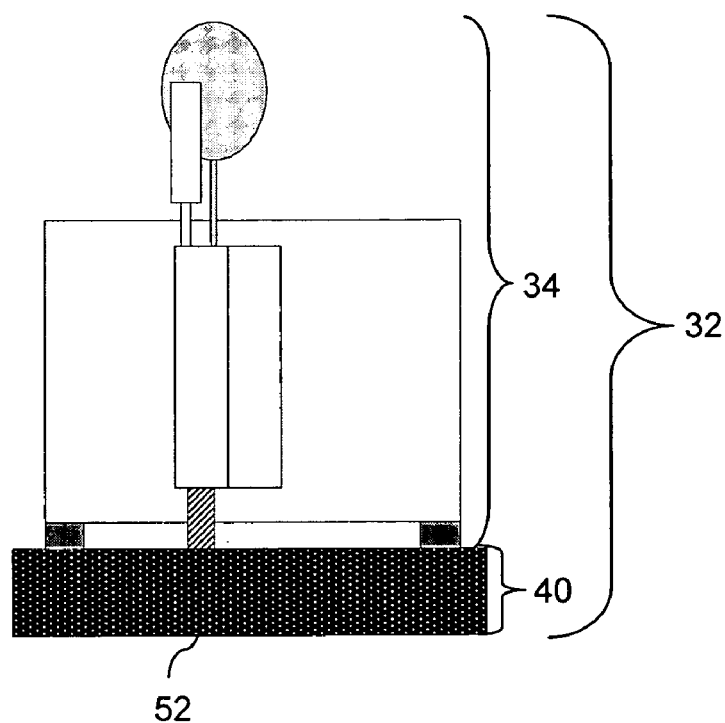
Figure 13A:
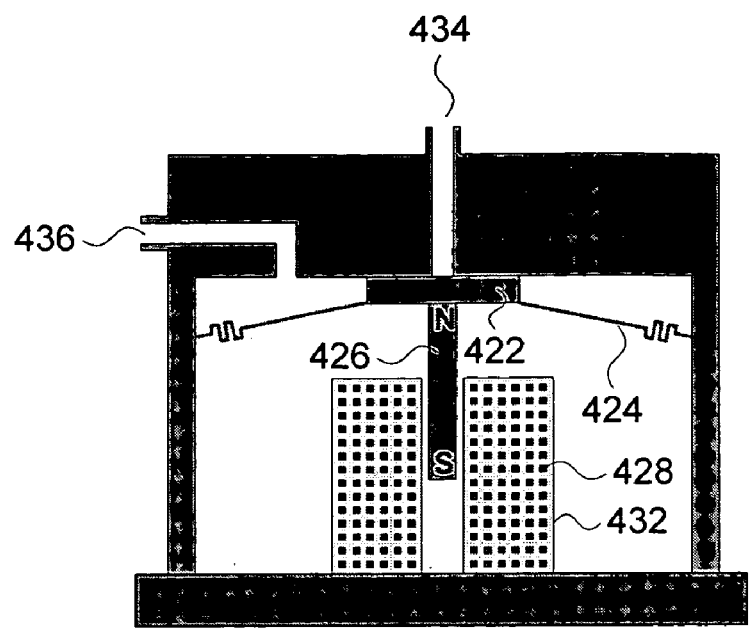
FIGS. 13A and 13B depict a valve which is bistable in operation.
Figure 13B:
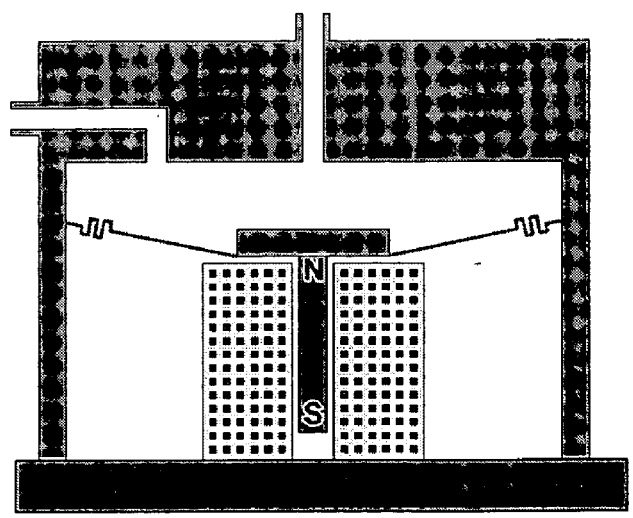

FIGS. 13A and 13B depict a valve which is bistable in operation: this latching behavior minimizes current consumption. The valve consists of a poppet 422 which is supported by a membrane 424 which is in compression and is stable either when convex (bent upwards) or concave (bent downwards). Corrugations in the membrane allow it to contract slightly when transitioning from convex to concave. Also attached to the poppet is a permanent magnet 426 which may be fabricated as part of an electrochemical fabrication process. The permanent magnet preferably forms the core of a solenoid with multiple windings 428 (e.g. of copper). These windings may be embedded in dielectric material 432 to provide mechanical stabilization and electrical isolation. It should be noted that the membrane also serves to guide the motion of the magnet. When current is applied to the coil in one polarity, the magnet will be drawn downwards as shown in FIG. 2B, pulling the poppet away from the valve seat to open the valve, and also deforming the membrane so that it is concave. At this time, current can be removed and the valve will remain open. When it is desired to close the valve, current of opposite polarity is applied to the coil, causing the magnet to be repelled from the coil. This forces the membrane to deform into its convex configuration, pushing the poppet against the valve seat. In alternative embodiments the inlet 434 and outlet ports 436 can be reversed from what is shown. Also, the diaphragm need not be continuous so long as it is acceptable to immerse the components below the diaphragm in the fluid controlled by the valve, and so long as the additional fluid force acting to hold the valve closed in the design shown can be overcome by the force produced by the magnet and coil.

Figure 14:
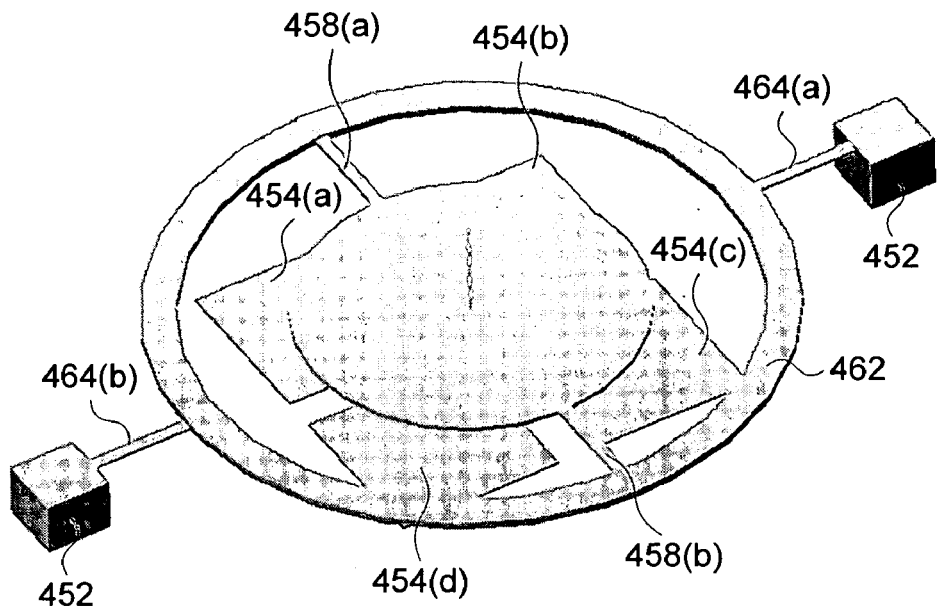
FIG. 14 depicts a perspective view of a three-dimensional tilt mirror.
Figure 15:
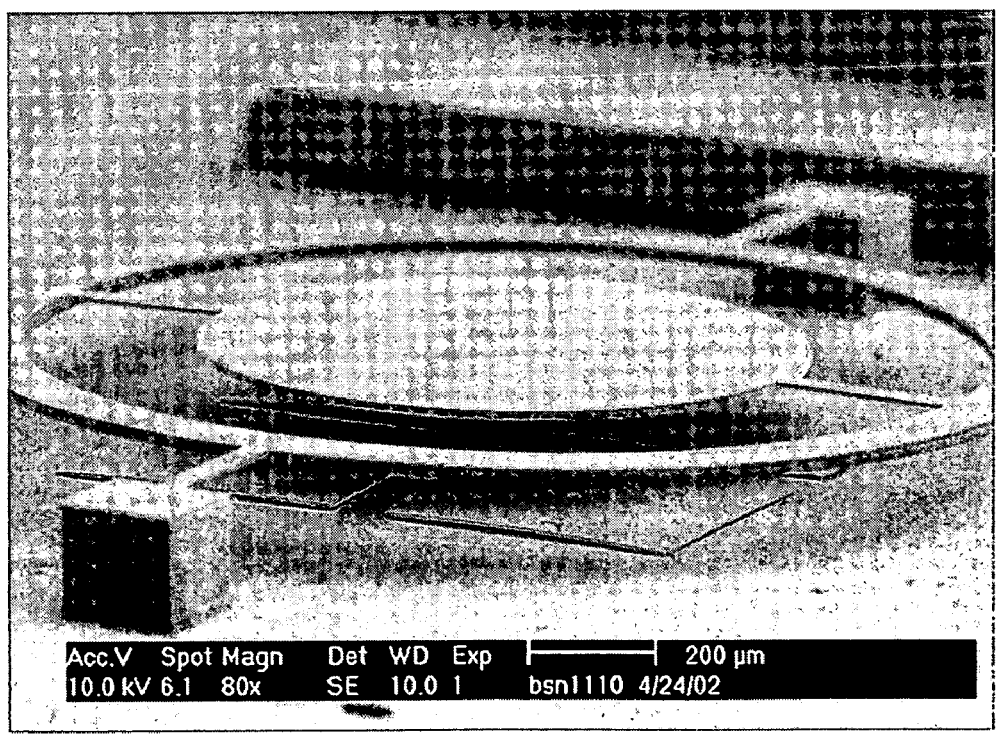
FIG. 15 illustrates an SEM image of a fabricated mirror of the design of FIG. 14.

FIG. 14 depicts a perspective view of a three-dimensional tilt mirror. The mirror assembly includes two support structures 452 which contact the substrate and four electrodes 454(a)-454(d) that also rest upon a substrate. The mirror 456 is supported by springs 458(a) and 458(b), by ring 462, and by springs 464(a) and 464(b) that allow rotation of the mirror and a direction substantially perpendicular to that allowed by springs 458(a) and 458(b). To cause tilting of the mirror a potential can be applied to one of blocks 452 and one or more of electrodes 454(a)-454(d). In some embodiments springs 458(a), 458(b), 464(a), and 464(b) maybe of the same material as the mirror surface. In some embodiments the mirror maybe thicker than the support springs. In still other embodiments the mirror may have a ribbed structure, thereby strengthening it while still maintaining a relatively low moment of inertia. Similarly the outer ring 462 may be thicker than the support springs. In still other embodiments, the drive electrodes may be suspended above the substrate to reduce parasitic capacitance while in other embodiments the springs of the mirror may be folded out of the plane of the mirror to decrease the horizontal extents of the monolithic mirror assembly. An SEM image of a fabricated mirror of the design of FIG. 14 is illustrated in FIG. 15.

Figure 16A:
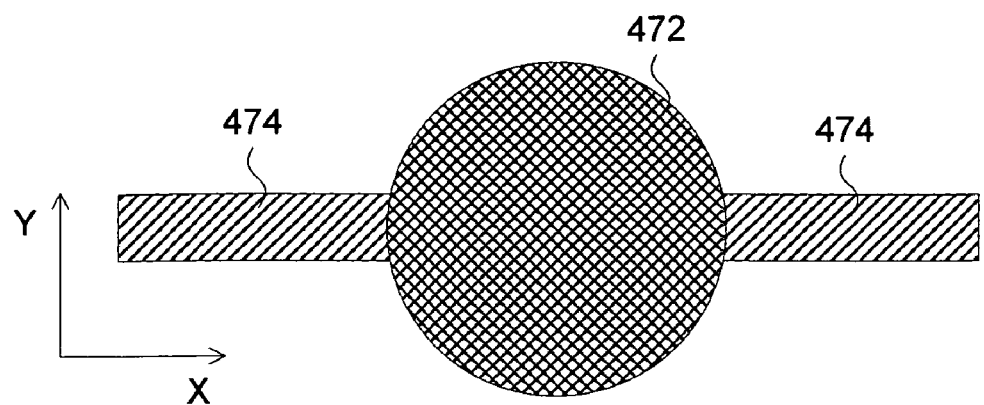
FIGS. 16A-16C depicts various views of a mirror according to an embodiment of the invention.
Figure 16B:
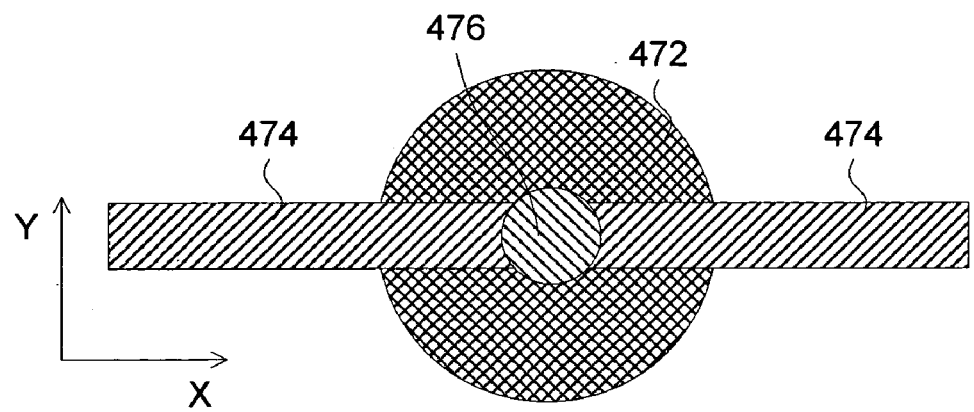
Figure 16C:
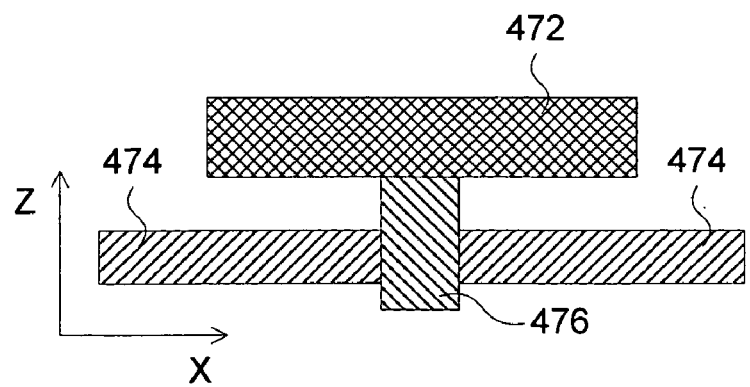

FIGS. 16A-16C illustrate an alternative embodiment of mirror support springs. FIG. 16A depicts a top view showing a mirror 472 located above two support springs 472. FIG. 16B illustrates a bottom view of the mirror 472 showing that support springs 474 contact a pedestal 476, which is located at the center of the mirror. FIG. 16C shows a side view which indicates that springs 474 are spaced out of the plane of mirror 472. As a result of this configuration less spring extent beyond the edge of mirror 472 is needed to allow a particular spring constant to be obtained. As such, an embodiment of this type can allow the horizontal extents of a mirror assembly to be reduced and thus an array of mirrors to be placed closer to one another.

Figure 17A:
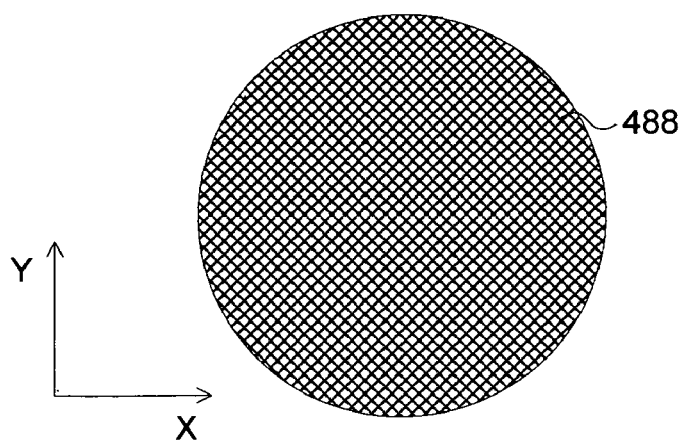
FIGS. 17A-17C depict various views of a mirror according to an embodiment of the invention.
Figure 17B:
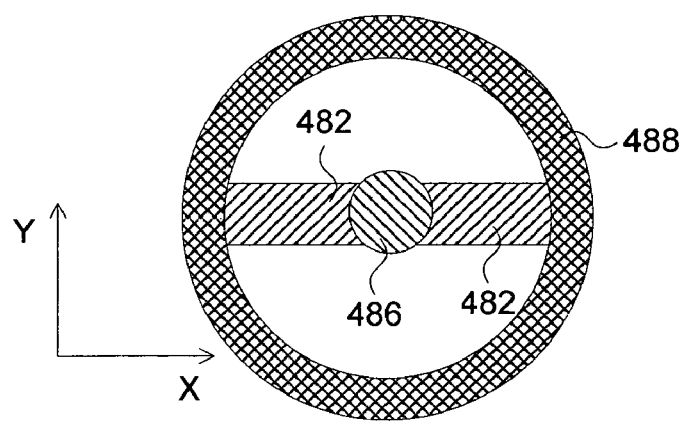
Figure 17C:
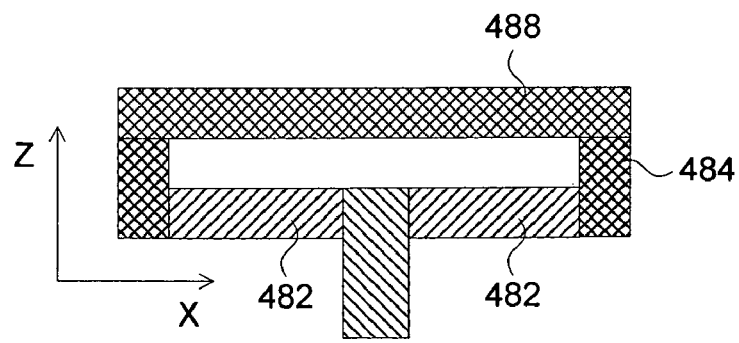

FIGS. 17A-17C depict another alternative embodiment for reducing the horizontal extents of the mirror assembly. As with FIGS. 16A-16C these figures only illustrate the springs and connections associated with a single axis of motion. It is to be understood that the other axis of motion may be obtained by appropriate design extension. FIG. 17A depicts a top view of a mirror where the springs and other rotational components are hidden beneath its surface. FIG. 17B depicts a bottom view of the mirror, where an outer ring attached to the bottom of the mirror can be seen with spring elements for 482 shown connected to the ring 484 and to a center piece 486. FIG. 17C indicates that springs 482 are separated from mirror 488 by their contact with ring element 484. Spring elements also connect to center post 486 which may be held in fixed position and the mirror may be made to rotate about the axis of springs 482.

Figure 18A:
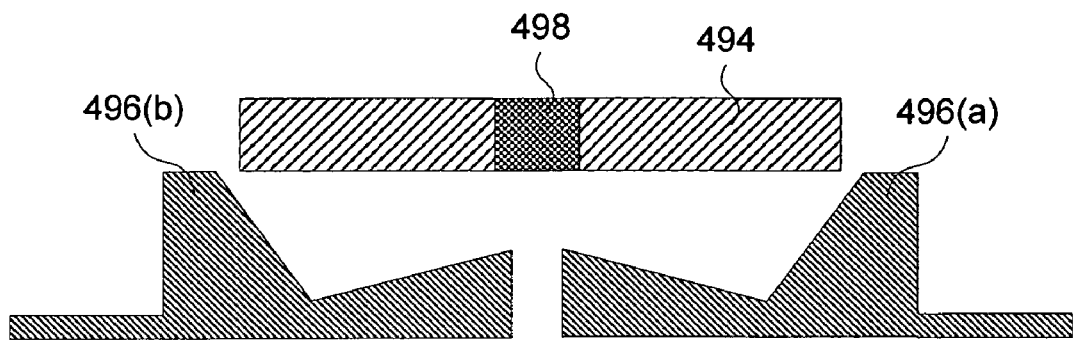
FIGS. 18A-18C depict various views of a mirror according to an embodiment of the invention.
Figure 18B:
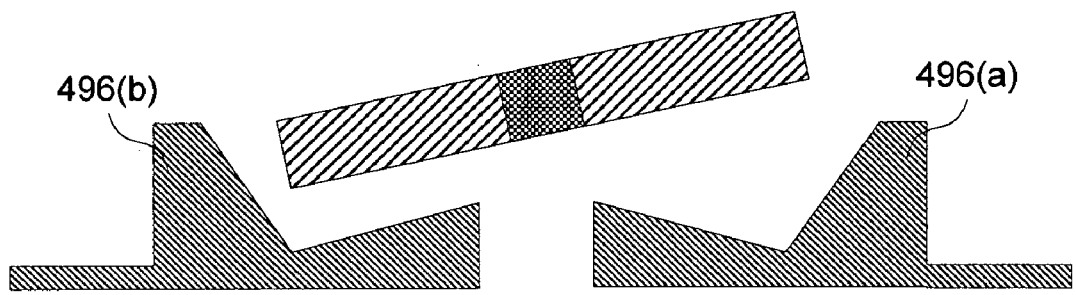
Figure 18C:
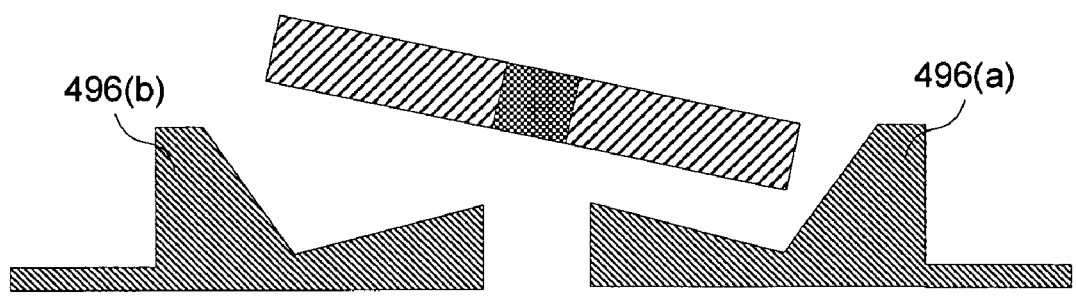

Another alternative mirror embodiment is illustrated in FIGS. 18A-18C which depict side views of a mirror 494 spaced above electrodes 496(a) and 496(b). At the center of mirror 494 a spring element 498 is illustrated which allows pivoting in the directions of electrodes 496(a) and 496(b). FIG. 18B illustrates the mirror tilted towards electrode 496(b) while FIG. 18C depicts mirror tilted toward electrode 496(a). Instead of using a planer electrode as is typical, the electrodes of this embodiment have a contoured shape which allows them to be positioned closer to the mirror surface to decrease the voltage required to cause it to rotate while also maintaining a position that does not hinder the movement of the mirror.

Figure 19A:
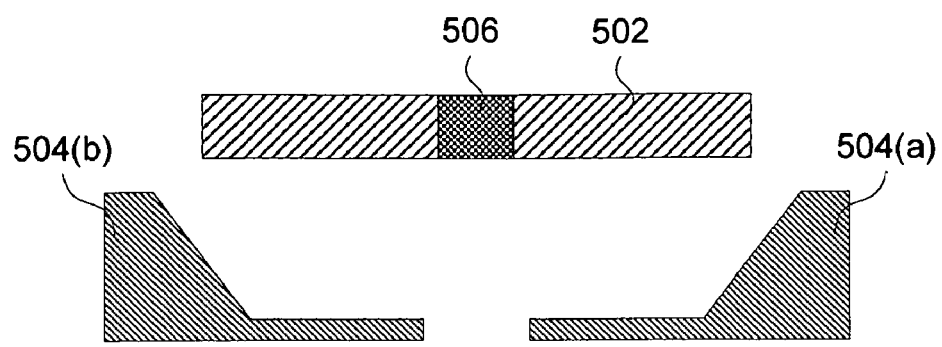
FIGS. 19A-19C depicts various mirror configurations according to various embodiments of the invention.
Figure 19B:
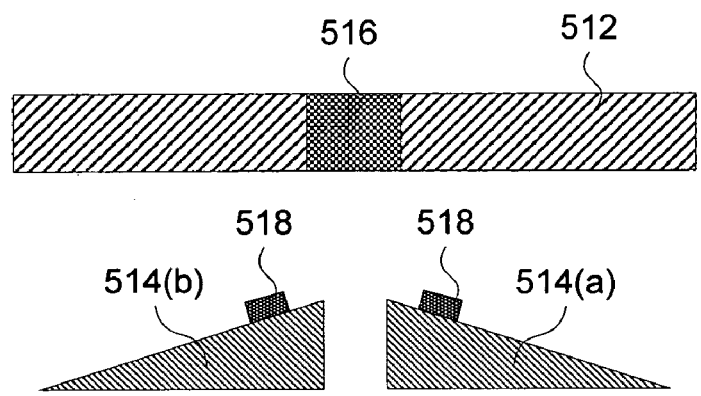
Figure 19C:
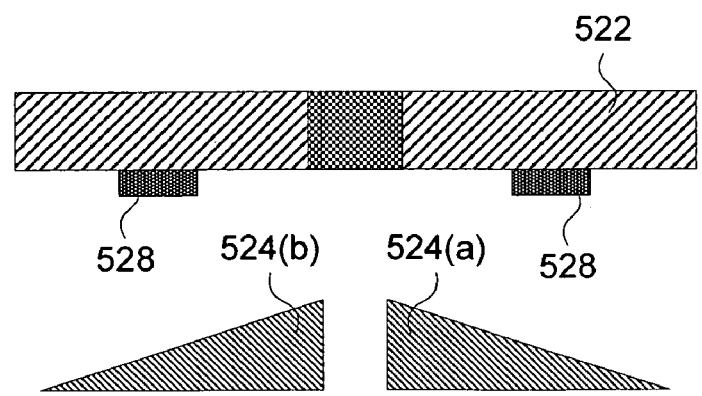

FIGS. 19A-19C depict further alternative scanner mirror embodiments. In FIG. 19A scanning mirror 502 is positioned above electrodes 504(a) and 504(b) and a spring element 506 is located at the center of mirror 502 this allows the mirror to rotate toward either electrode 504(a) or 504(b). The distinguishing feature of this embodiment as compared to the embodiment of FIGS. 18A-18C is that only the outer extents of the mirror are positioned at an elevated level while the portions of the electrodes approaching the center of the mirror remain flat. In FIG. 19B, mirror 512 is positioned above electrodes 514(a) and 514(b). Spring element 516 allows the mirror to pivot toward the electrodes which in this case have an elevated configuration toward the center of the mirror without any electrode elevation near the sides of the mirror. Additionally in this embodiment stops of dielectric material 518 are located on electrodes 514(a) and 514(b) so as to inhibit mirror 512 from contacting the electrodes. FIG. 19C, is similar to 19B with the exception that dielectric stops 528 are located on the bottom of mirror 522 as opposed to on electrodes 524(a) and 524(b).

Figure 20A:
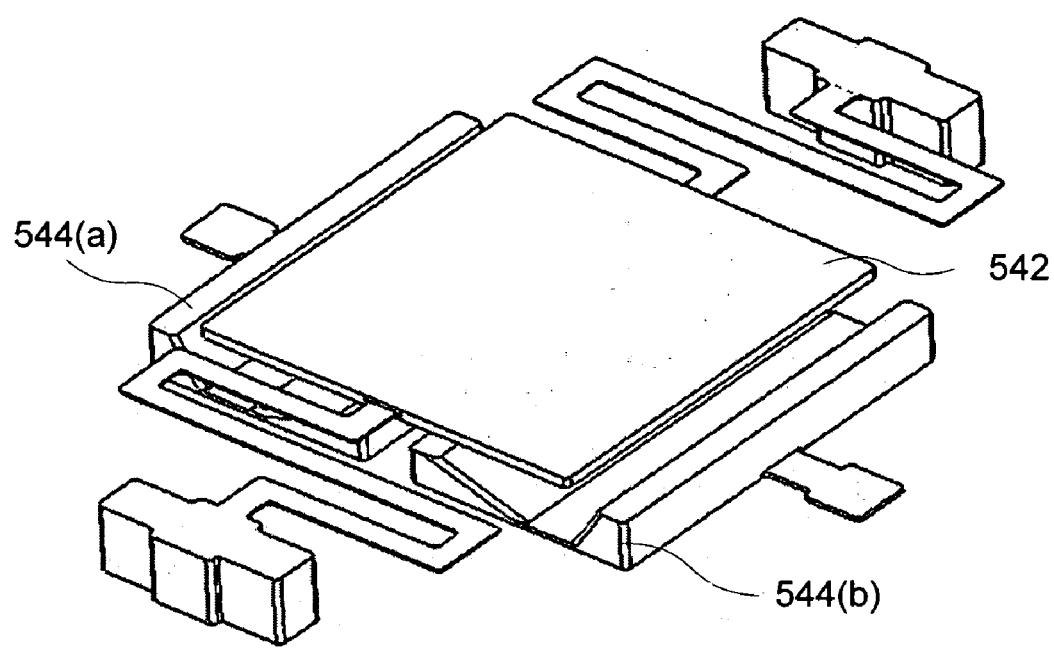
FIGS. 20A-20B depict perspective views of a mirror design and a fabricated mirror, respectively, according to an embodiment of the invention.
Figure 20B:
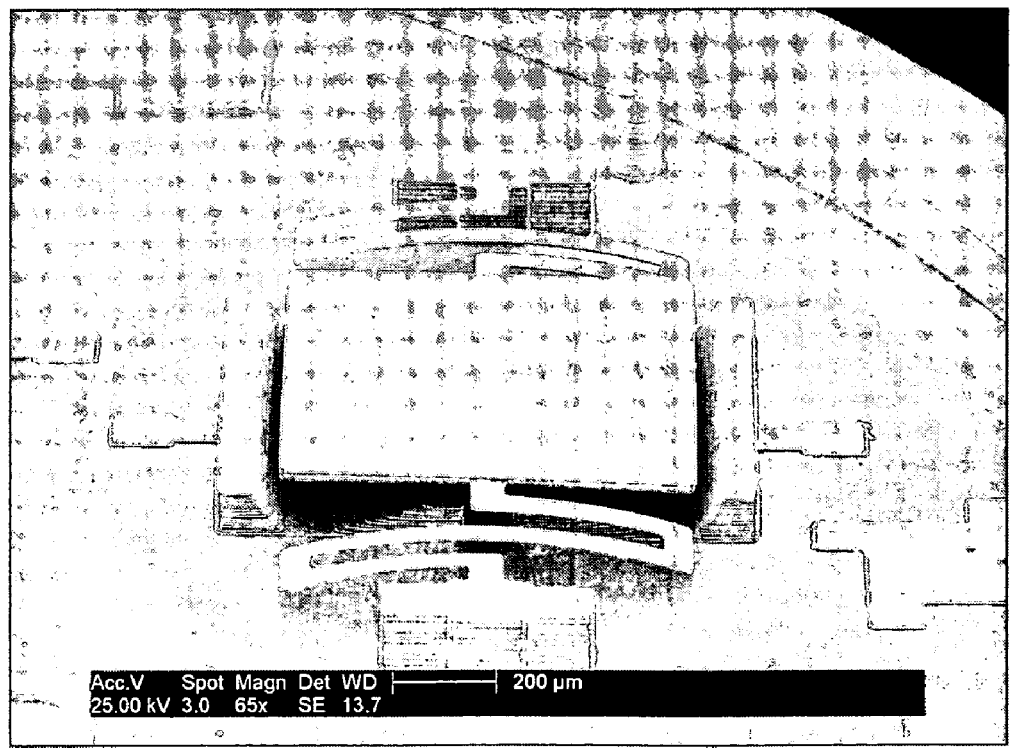

Another alternative embodiment is depicted in FIGS. 20A and 20B. FIG. 20A depicts a perspective view of a mirror 542 positioned above electrodes 544(a) and 544(b). The electrodes of this embodiment have a similar configuration to those of FIGS. 18A-18C. In the examples of FIGS. 18A-20A, the electrodes are shown as having smoothed faced slanted surfaces. Such smoothness is obtainable in some embodiments potentially by performing an additional deposition operation after formation of all layers of a structure and release of the structure from a sacrificial material. However in other embodiments the electrodes may remain with slanted surfaces with a stair step configuration as the height of the electrodes would be formed from a series of layers stacked one upon the other. FIG. 20B depicts an SEM image of a fabricated mirror of the configuration shown in FIG. 20A. The stair step nature of the electrodes can be seen in this figure.

Figure 21A:
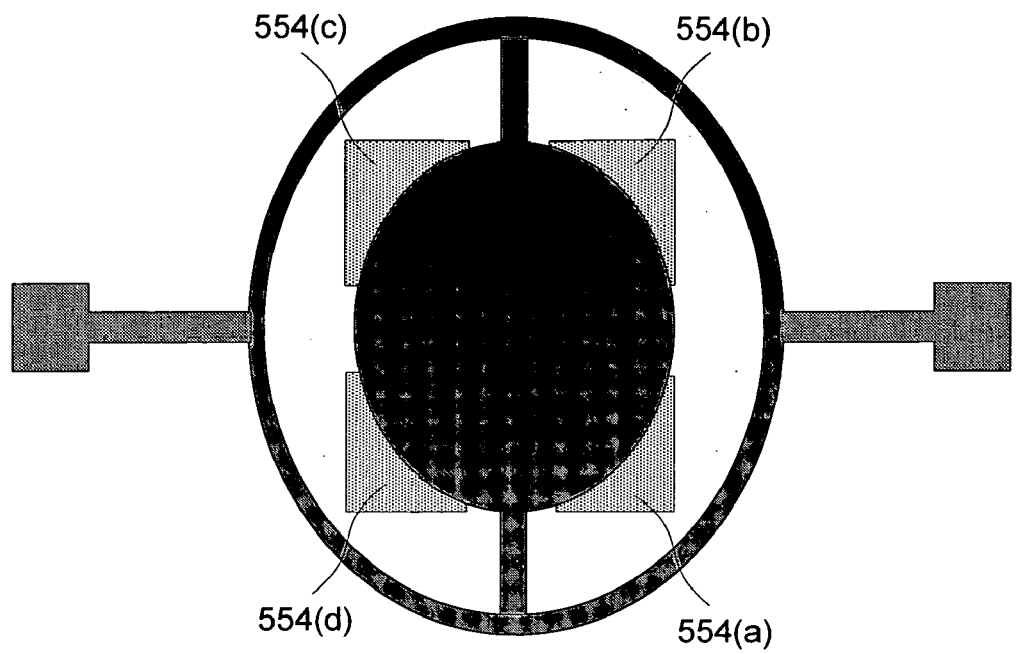
FIGS. 21A-21B depict a scanning mirror and an actuation electrode, respectively, for an embodiment of the invention.
Figure 21B:
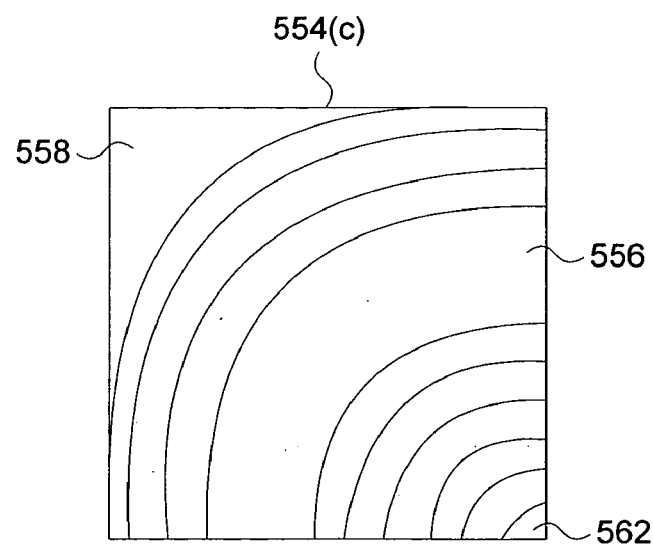
Figure 21C:
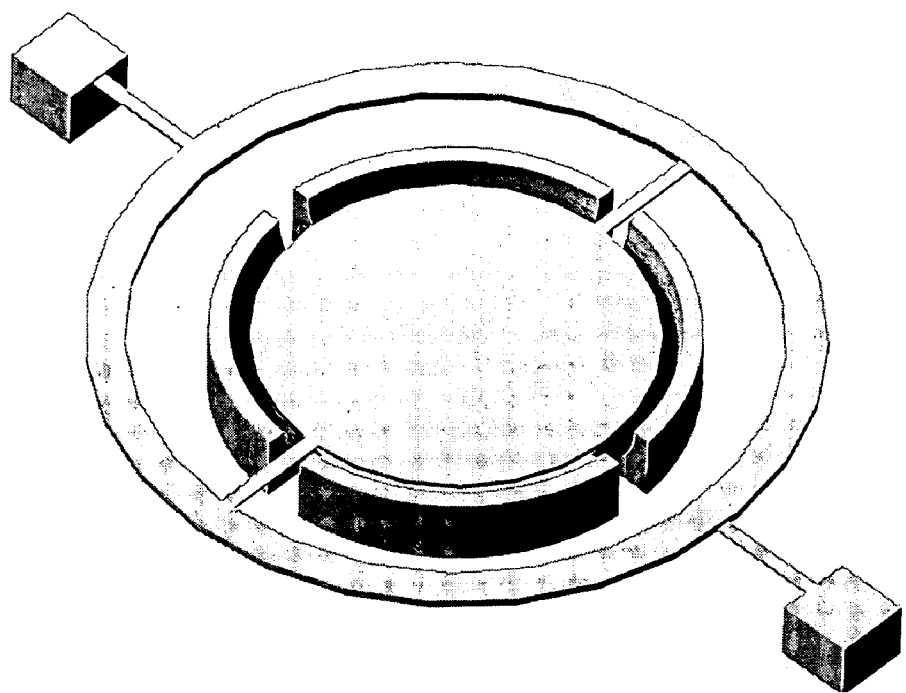
FIG. 21C depicts another alternative embodiment where electrode elevation is contoured to approximate, at least in part, the path of traveled by the mirror.

Another alternative scanning mirror embodiment is illustrated in FIGS. 21A-21C. FIG. 21A depicts a scanning mirror, very similar to the scanning mirror of FIG. 14 with the difference that electrodes 554(a)-554(d) have an elevated configuration as opposed to the flat configuration of FIG. 14. FIG. 21B depicts layer contour levels of electrode 554(c), where the center portion 556 of electrode 554(c) is at the lowest level while portion 558 is at an elevated level with regions between 556 and 558 at intermediate levels. Similarly 562 is at an elevated level with portions between 556 and 562 at intermediate levels. FIG. 21C depicts another alternative embodiment where electrode elevation is contoured to approximate, at least in part, the path of travel by the mirror. In FIG. 21C the electrodes have a curved configuration while in FIG. 21A and 21B had a square configuration.

Many additional alternative mirror embodiments are possible. In some such alternatives densely packed fields of components that include mirrors or other relatively high voltage components or components that carry high frequency signals may benefit from the fabrication of walls of conductive material around their perimeter. These walls of conducted material may be grounded, thereby helping to shield nearby components from negative influenced associated with the electrical activity of other components. Similarly such walls may help shield the other components from the electrical activity of the surrounded components.

Figure 22:
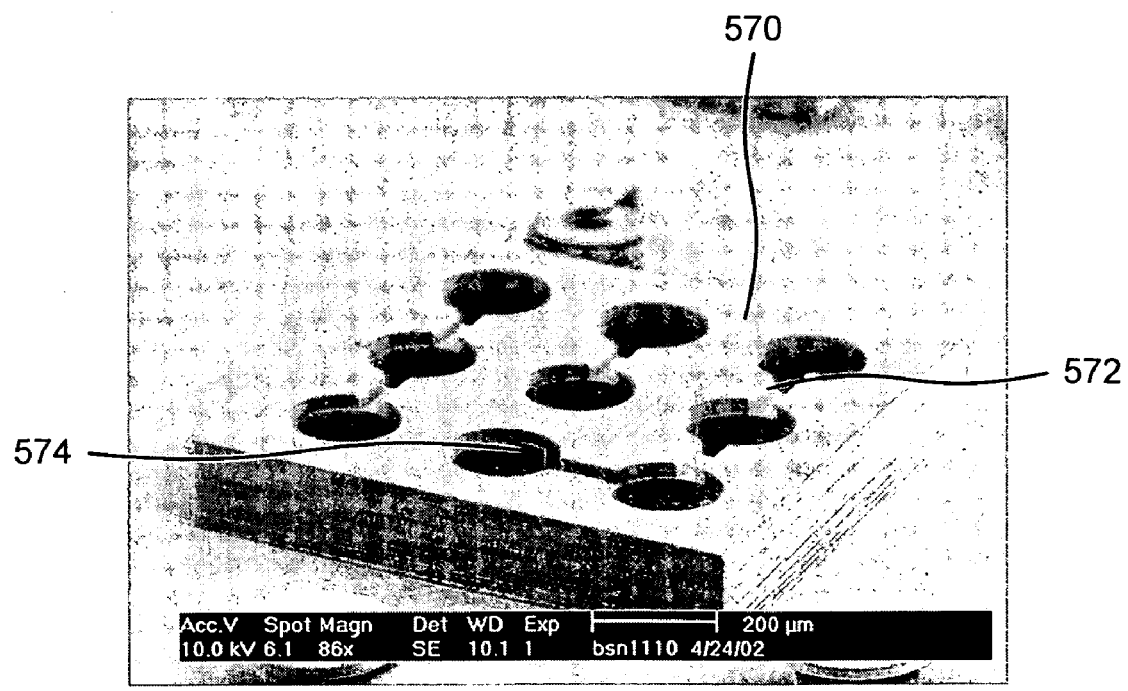
FIG. 22 depicts a structure containing a number of microchannels connecting wells.

Another embodiment of the present invention is illustrated in Fabricated device of FIG. 22. FIG. 22 depicts a structure containing a number of microchannels connecting wells. Microfluidic systems often require complex networks of wells and channels for their operation. Such channels can be used to make multilayer fluidic networks which include channels running in different directions, transitioning between different heights, wells, integrated valves, pumps, mixers, connectors and couplings, and so on.

Electrochemical fabrication technology can be used to fabricate tooling to enable a wide variety of industrial processes on a small scale. Examples of such tooling are as follows:

Electrical Discharge Machining (EDM). Electrodes suitable for EDM of various materials (including tool steels) can be made with electrochemical fabrication technology, particularly from copper and other electrodepositable elements and alloys that can be used as structural material in electrochemical fabrication technology. Materials with low erosion properties during EDM are preferred. Tooling for EDM grinding and related processes can also be created by co-depositing abrasive particles (e.g., diamond, silicon carbide, boron carbide, aluminum oxide) along with metal.

Electrochemical Machining (ECM). Tooling suitable for ECM, electrochemical deburring, shaped tube electrolytic machining, and related means of processing a variety of materials can be made with EFAB technology. Tooling for electrochemical grinding and similar processes can also be created by co-depositing abrasive particles (e.g., diamond, silicon carbide, boron carbide, aluminum oxide) along with metal.

Electroplating. Anodes with special shapes intended to control current distribution during plating, enhance plating within a cavity, and so forth may be made with electrochemical fabrication technology, for example, from copper, nickel, and platinum.

Ultrasonic machining. Tooling for ultrasonic machining of such materials as carbides, ceramics, glass, and metals including stainless steel can be made with electrochemical fabrication technology. Tool life can be improved by co-depositing abrasive particles (e.g., diamond, silicon carbide, boron carbide, aluminum oxide) along with metal when fabricating the tool.

Injection and other molding. Tooling for injection, compression, and transfer molding of components from polymers, mixtures of polymers and metal (to fabricate metal injection molding preforms via 'metal injection molding') or of polymers and ceramic (to fabricate ceramic components via 'ceramic injection molding') can be made with EFAB technology. Tooling can consist of multiple elements which when combined form a cavity into which material is introduced.

Blow and rotational molding. Tooling for blow molding and rotational molding can be made with electrochemical fabrication technology. Tooling can consist of multiple elements which when combined form a cavity into which material is introduced.

Extrusion molding. Dies for extruding polymers, metals, polymer/metal and polymer/ceramic mixtures (in which the polymer is later removed and the metal or ceramic is sintered) can be made with electrochemical fabrication technology. Spinnerets—essentially extrusion dies for polymers used in the fabrication of synthetic fiber—can similarly be fabricated. Due to electrochemical fabrication technology's 3-dimensional nature, semistreamlined and fully streamlined production dies can be created, in which the die geometry is curved away from the extruded structure on the exit side of the die. Dies designed to produce hollow extrusions such as tubing and multi-lumen catheters for medical applications—both featuring unusually small diameters—can be produced.

Figure 23:
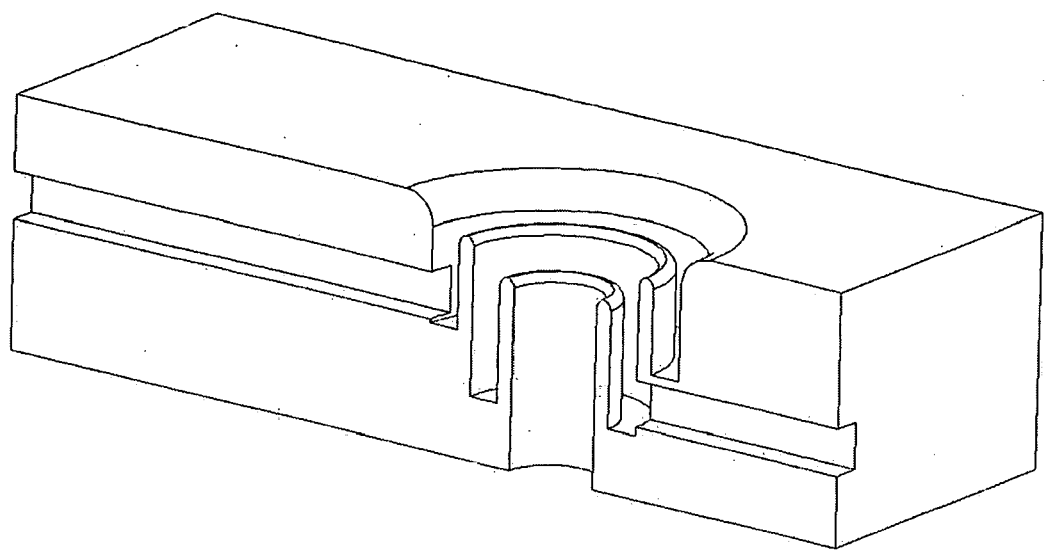
FIG. 23 shows a cross section of a coaxial extrusion die designed to be fabricated with electrochemical fabrication technology and which is capable of extruding up to three different materials.

Of particular interest is the fabrication of extrusion dies capable of extruding multiple materials simultaneously to form a composite structure. FIG. 23 shows a cross section of a coaxial extrusion die designed to be fabricated with electrochemical fabrication technology and which is capable of extruding up to three different materials to form a coaxial composite extrudate such as that in FIG. 24A. The design can be extended to more than three materials. In FIG. 23, material is supplied through three separate inlets; these can be on any desired face of the die. The edges on the exit side of the die are preferably rounded to provide streamlining.

Figure 24:
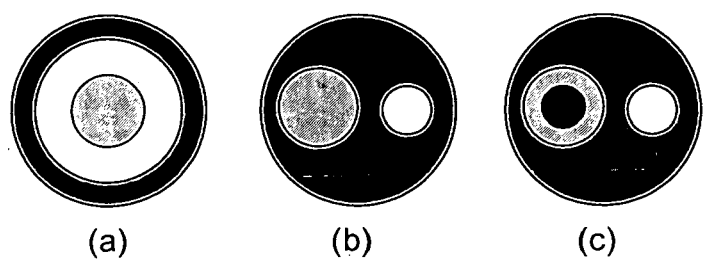
FIGS. 24A-24C depict samples of extrudates as might be generated from the extrusion die like that of FIG. 23.

The inner dividing wall (which separates the center and inner material) may be recessed below the outer dividing wall so as to allow the center and inner materials to contact and fuse while the center material is still supported by the outermost wall. Similarly, the outer dividing wall (which separates the outer and center material) may be recessed below the outermost wall so as to allow the outer and center materials to contact and fuse while the outer material is still supported by the outermost wall. Other configurations of extrusion dies for multiple materials can, as shown in FIG. 24B, produce extrudates in which two or more materials are surrounded by a single material, or which combine the geometries of the extrudates in both FIGS. 24A and 24B, as shown in FIG. 24C.

Figure 25:
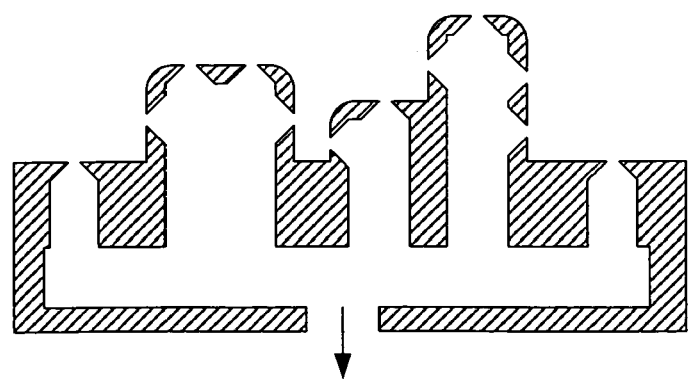
FIG. 25 shows how a single vacuum manifold can connect all the vacuum holes in a surface according to an embodiment of the invention.

Thermoforming. Tooling for thermoforming of materials such as thermoplastics can be made with electrochemical fabrication technology. Vacuum applied through apertures in the forming surface of the tool (FIG. 25) or air pressure applied to the opposite side of the sheet of material to be formed, or both, can be used to form the sheet over the shape of the tool. The tool in FIG. 25 shows how a single vacuum manifold can connect all the vacuum holes in the surface, and also illustrates flaring of the vacuum holes inwards to enlarge them and promote etching of sacrificial material. Such tooling can also be used to form ductile material supplied in thin sheets, with or without heating or the use of vacuum or pressure.

Die casting and permanent mold casting. Tooling for die casting and permanent mold casting of metals, particularly those with relatively low melting points (aluminum, magnesium, zinc, and of course, indium, tin, Cerro metals, and solder) can be made using electrochemical fabrication technology. Tooling can consist of multiple elements which when combined form a cavity into which material is introduced.

Metal forming. Tooling for drop forging and impact extrusion, progressive die drawing, progressive roll forming, stretch-draw forming, tube bending, tube and wire drawing, deep drawing, and brake forming can be made with electrochemical fabrication technology.

Powder metal and ceramic die pressing. Tooling for consolidating metal and ceramic powders into preforms through pressure and—optionally—heat, prior to sintering can be made with electrochemical fabrication technology.

Machining. Tooling for broaching and fine blanking; gear hobbing and gear shaping; lancing, shearing, and bending; nibbling and notching; slitting; and punching, perforating and blanking can be made with electrochemical fabrication technology. Taps and dies for threading; drills, mills, files, lathe tools (e.g., for turning, facing, and boring); and routing, shaping, and planing tools can also be made with electrochemical fabrication technology.

Abrasive machining. Tooling for grinding, electrochemical grinding, EDM grinding (as already mentioned), and honing can be produced with EFAB technology. In addition, tooling for orbital grinding (e.g., of graphite, but also of much harder materials) can be fabricated in this way. Dicing saws for cutting semiconductor, ceramic, and glass wafers can also be fabricated. All such tooling, which relies on an abrasive action, can be made by co-depositing abrasive particles (e.g., diamond, silicon carbide, boron carbide, aluminum oxide) along with metal.

The hardness and wear resistance of all of the above tooling may be made increased by co-depositing particles (e.g., diamond, silicon carbide, boron carbide, aluminum oxide) along with electrochemically-deposited metal. Alternatively, spray metal deposition may be used to blanket deposit tool steel and other structural materials desirable for tooling applications as the structural material in electrochemical fabrication technology.

Since tooling often requires high strength, diffusion bonding of the layers in tooling produced by electrochemical fabrication technology may be carried out by heating the tooling to a temperature which promotes diffusion across the layer interface. This can be carried out either before or after removal of the sacrificial material.

Tooling may also be fabricated indirectly—not as the direct result of electrochemical fabrication technology, but for example, by using an electrochemical fabrication technology-produced copper electrode to electrical discharge machine tool steel which then serves as the final tool.

Figure 26A:
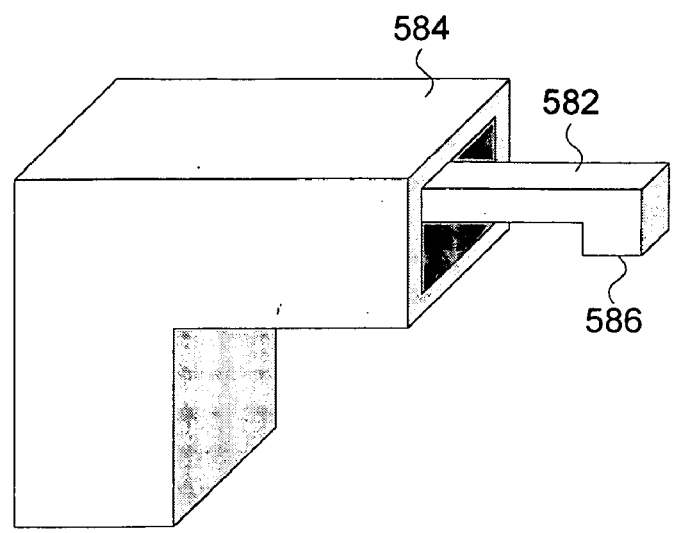
FIGS. 26A and 26B illustrate different probe tip configurations.
Figure 26B:
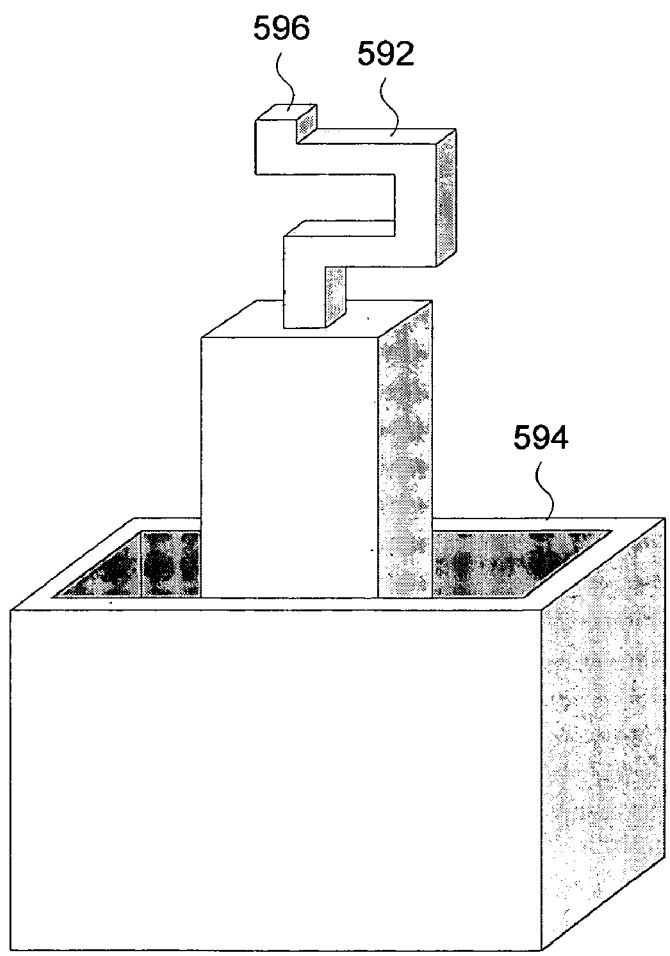

Another Embodiment of the instant invention is shown in FIGS. 26A and 26B. FIGS. 26A and 26B illustrate two different probe tip configurations that may be used for probe cards or in other electrical test environments. The probe electrodes 582 and 592, respectively, are located within shields 584 and 594, respectively, until the probe tip is approached at which point the shield is allowed to drop away to allow contact between tips 586 and 596 with pads to be tested. Probe cards are used to test and measure integrated circuits during production. The move to higher frequencies for these integrated circuits causes a higher demand to be placed on the performance of probe cards. Further more as IC's move to finer pitches, probes must be of smaller and finer pitch. To improve operation of these probes at higher frequencies, it is proposed herein and illustrated in FIGS. 26A and 26B that such probes remain shielded (e.g. at ground potential) for as much of the probe length as possible.

Figure 27:
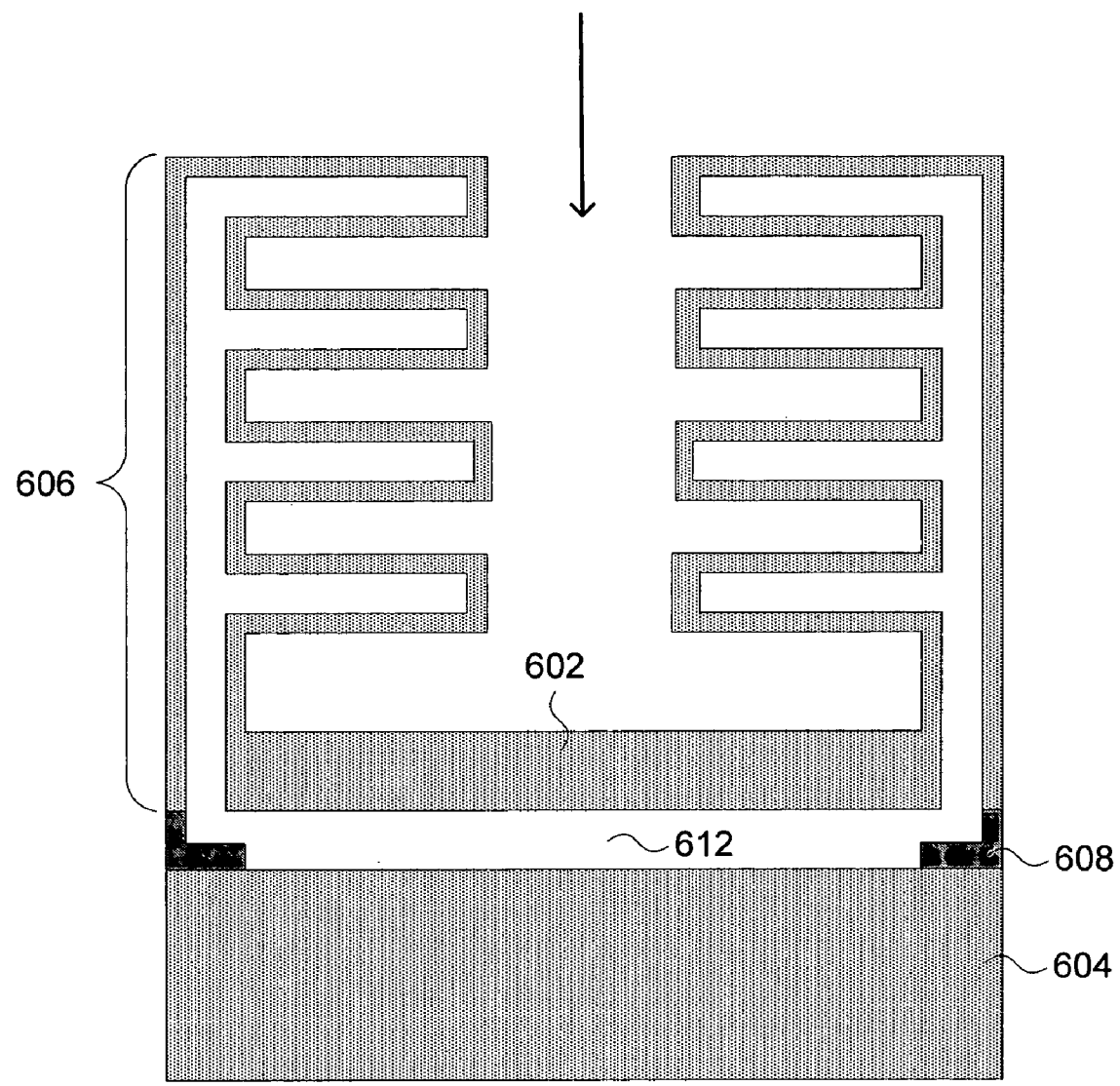
FIG. 27 illustrates a pressure sensor whose movement is controlled by a bellows-like structure.

Another embodiment of the instant invention is illustrated in FIG. 27. FIG. 27 illustrates a pressure sensor whose movement is controlled by a bellows like structure. The sensor consists of moveable plate 602, fixed plate 604, bellows structure 606 and dielectric 608 that separates plates 602 and bellows 606 from plate 604. As pressure changes, the bellows can extend or alternatively can retract, thus changing the separation between plates 602 and 604 and changing an associated capacitance which can be detected and correlated to a given pressure differential. The differential being that between the pressure outside the sensor and the pressure inside sealed area 612.

Figure 28A:
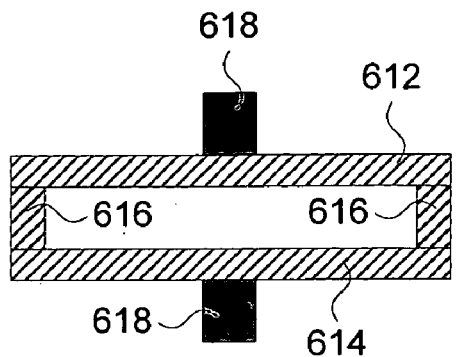
FIGS. 28A-28D depicts various actuators according to an embodiment of the invention.
Figure 28B:
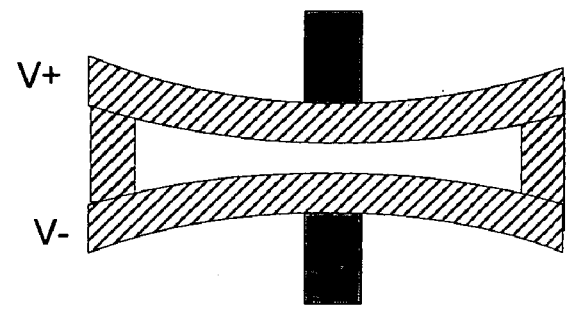
Figure 28C:
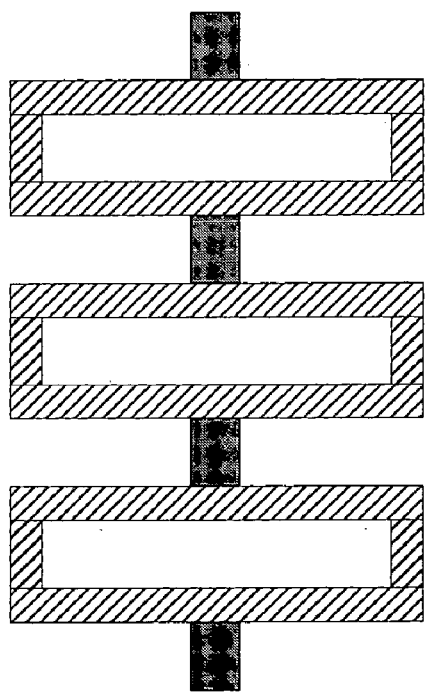
Figure 28D:
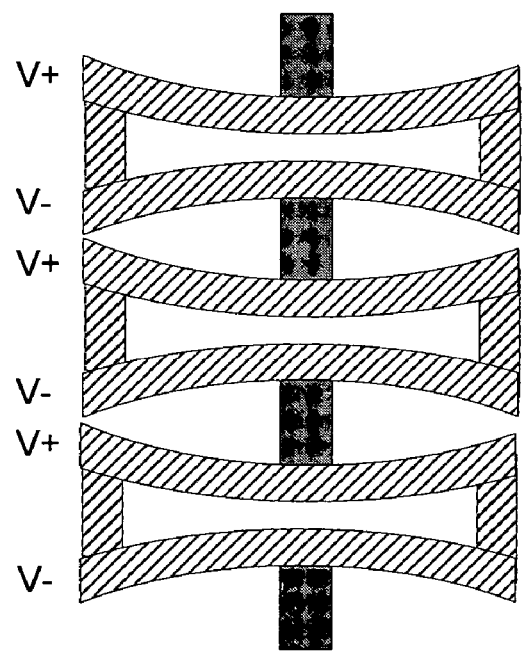
Figure 29A:
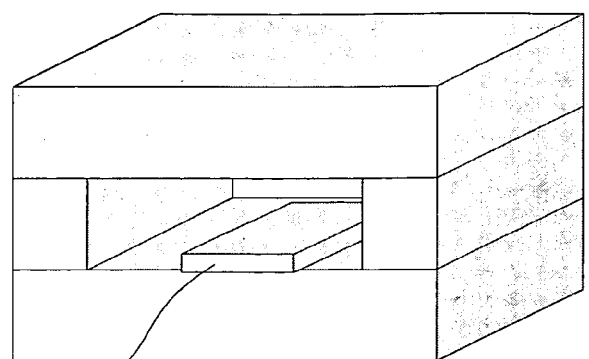
FIGS. 29A and 29B depict perspective view of the actuators similar to those in FIGS. 28A and 28B.
Figure 29B:
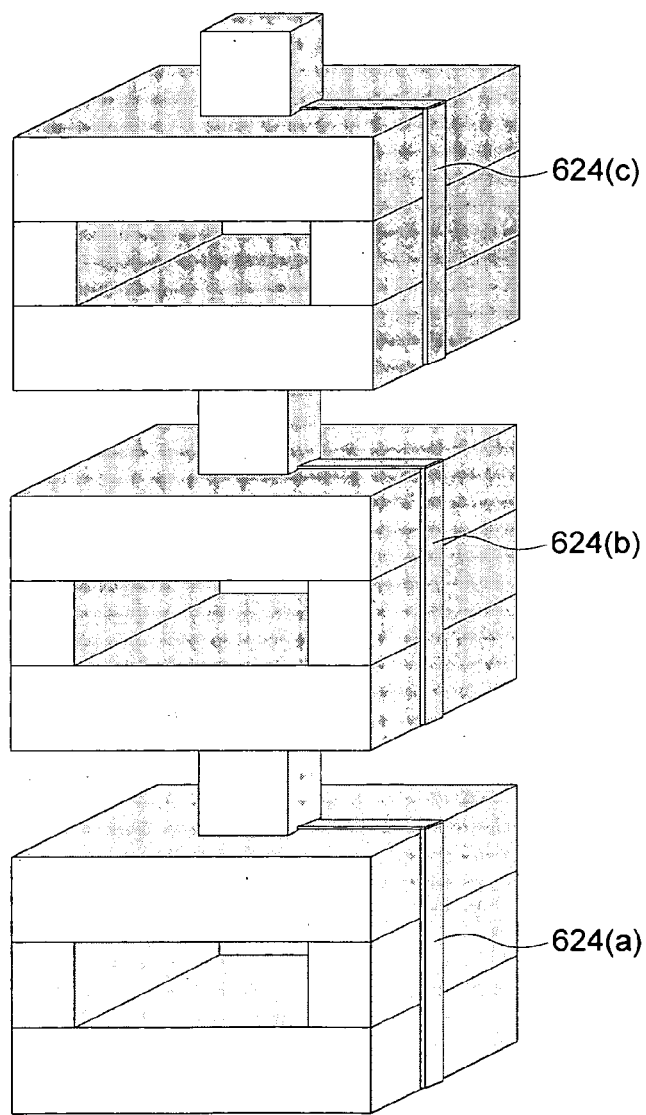

An additional embodiment of the invention is illustrated in FIGS. 28A-28D. FIG. 28A depicts a pair of capacitor plates 612 and 614 held apart by spacers 616 where extension rods 618 extend from either side of the center of the capacitor by application of a voltage differential between plate 612 and 614. The plates can be made to attract one another and bend inward. Such bending will cause displacement of extension rods 618 compressing their end to end separation. Such a configuration may be used as an actuator. Multiple such actuators can be combines together to form stacks capable of more extensive end to end displacement. Appropriately configured parallel configurations can be used to increase to overall displacement force. A combination of series and parallel configurations may also be useful. Such actuator combination, could exert both greater force and increased displacement. A perspective view of a single such actuator is shown in FIG. 29A where a dielectric pad 622 is placed between the capacitor plates to inhibit inadvertent shorting of them. FIG. 29B illustrates a perspective view of three such stacked plates where electrical lead lines 624(a), 624(b) and 624(c) extend along the sides of the plates.

Figure 30A:
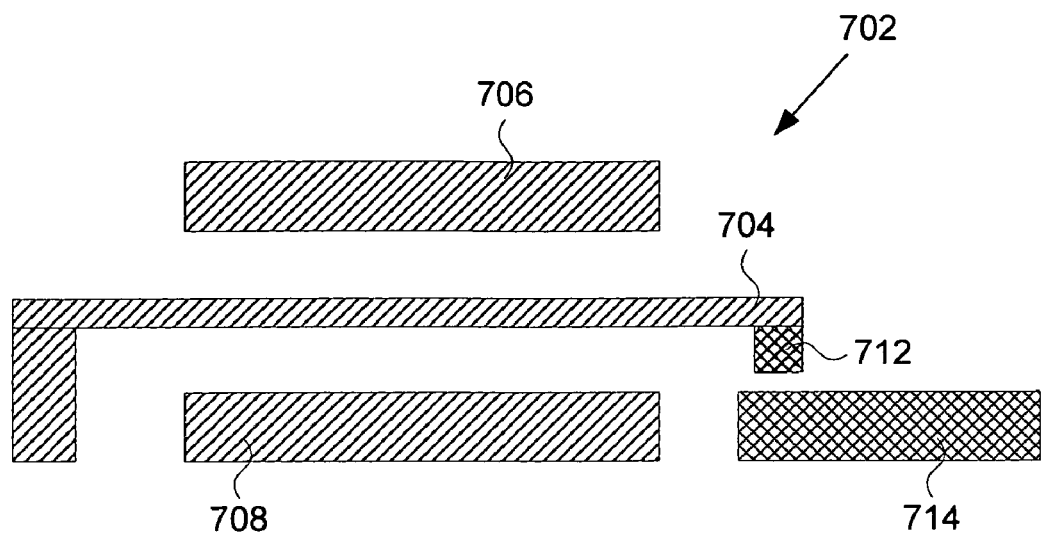
FIGS. 30A-30F depict various switches according to different embodiments of the invention.
Figure 30B:
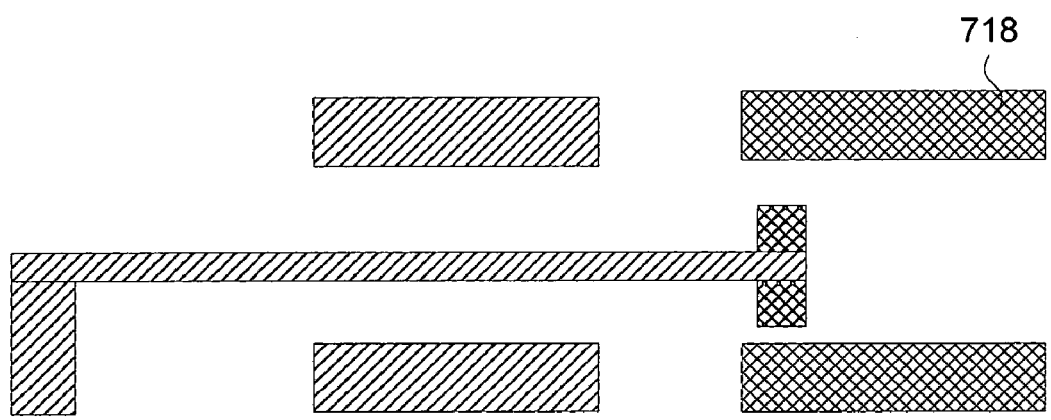
Figure 30C:
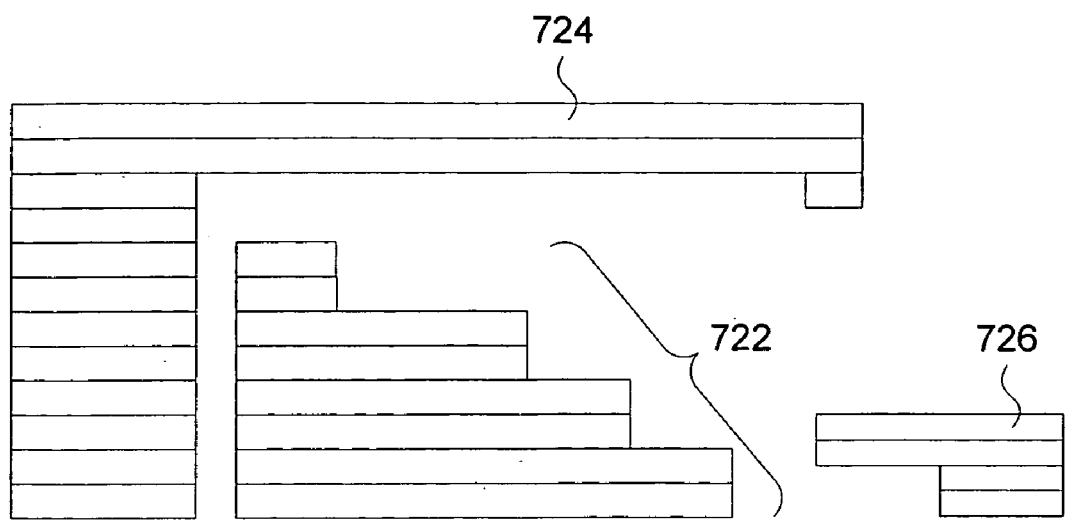
Figure 30D:
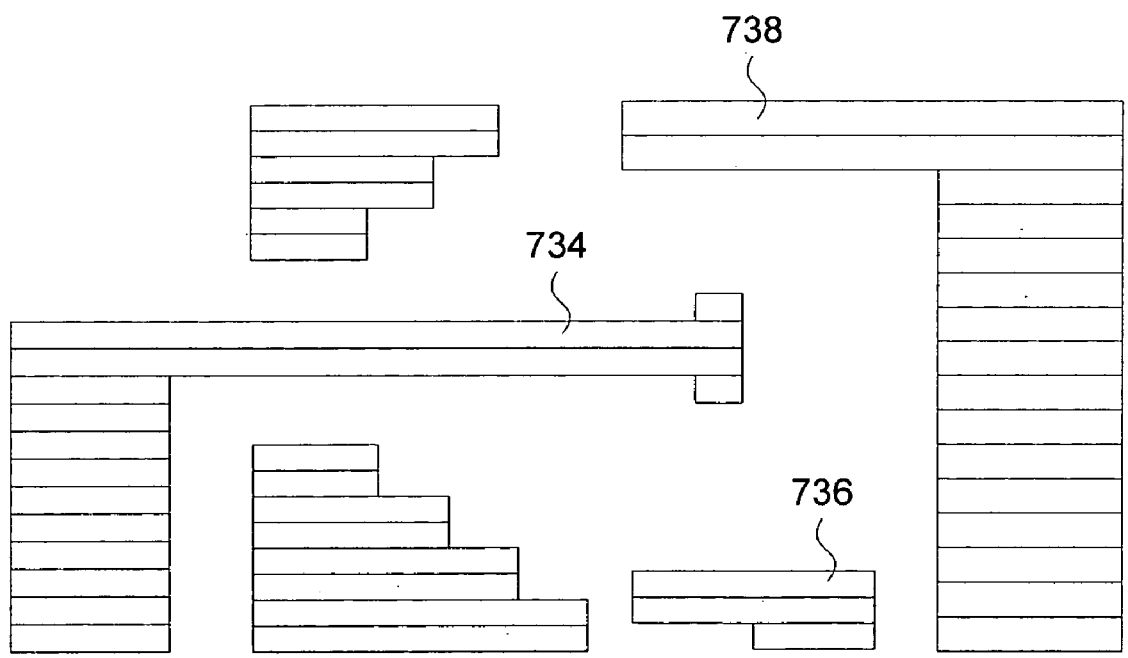
Figure 30E:
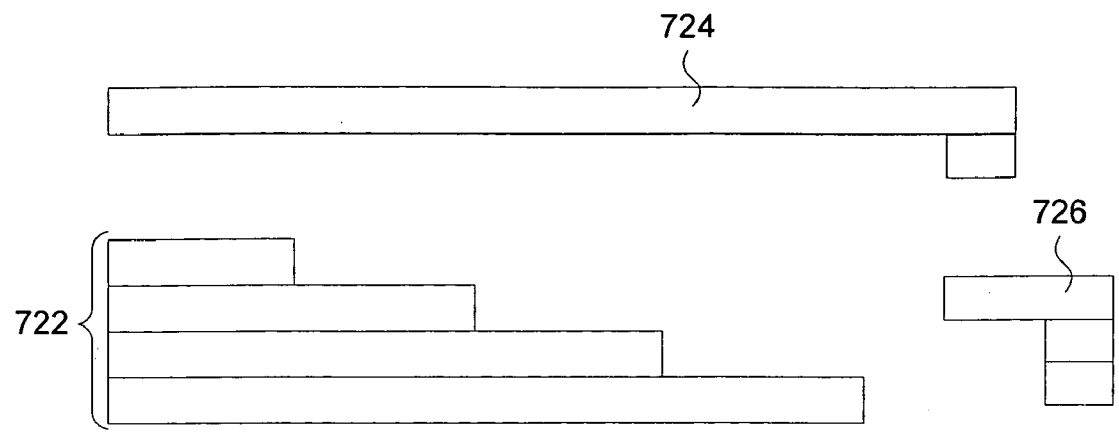
Figure 30F:
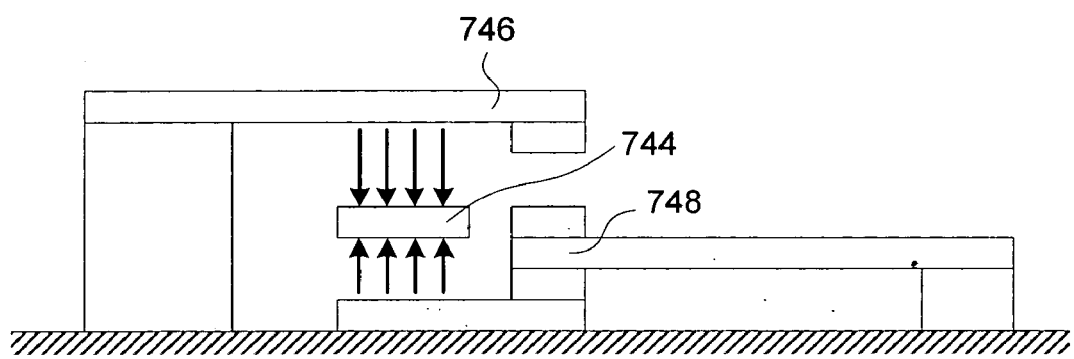
Figure 31A:
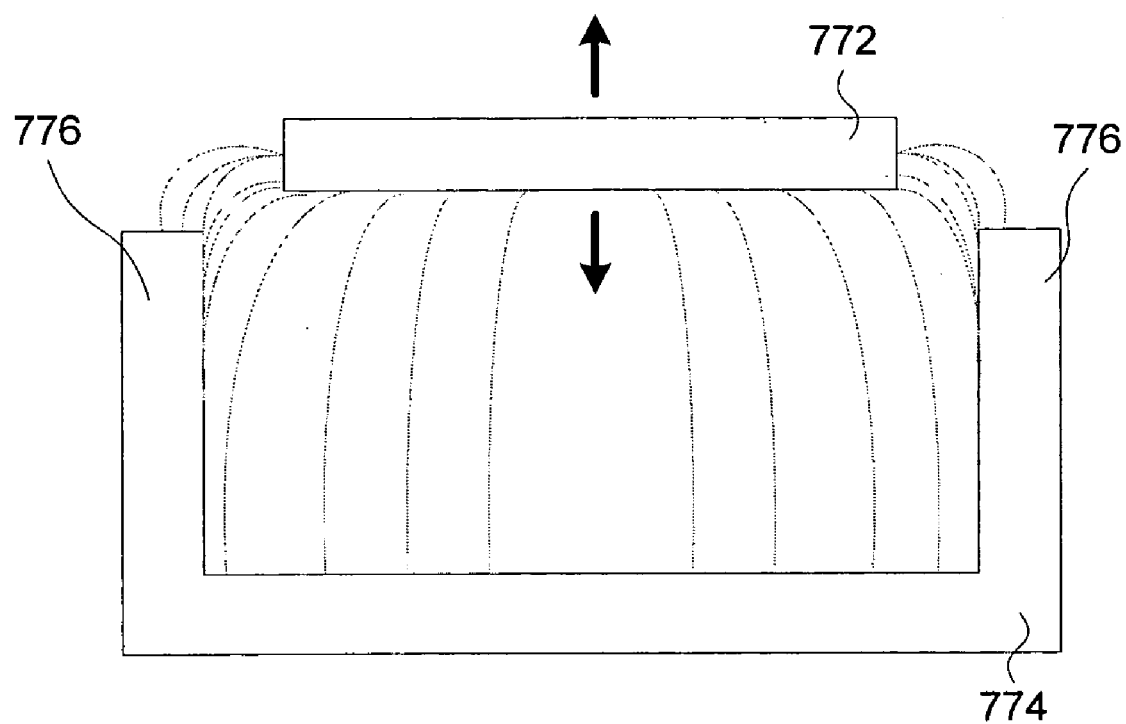
FIGS. 31A-31C depicts various electrode and beam relationships according to different embodiments of the invention.
Figure 31B:
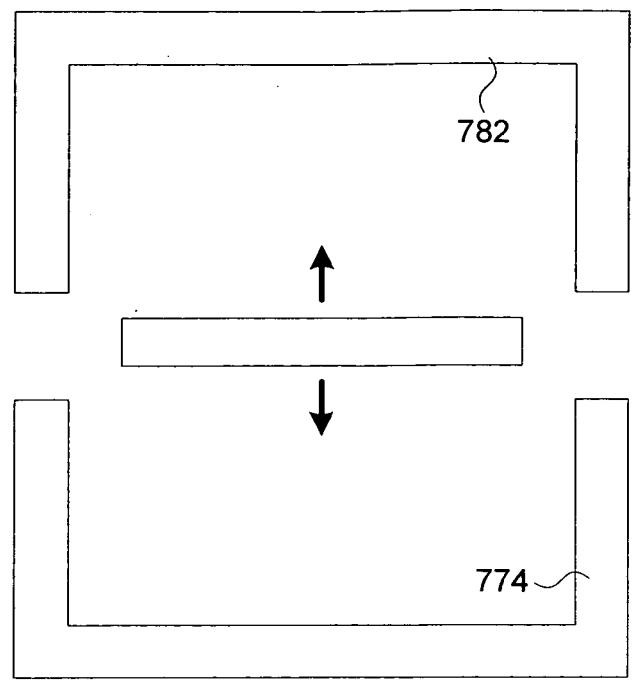
Figure 31C:
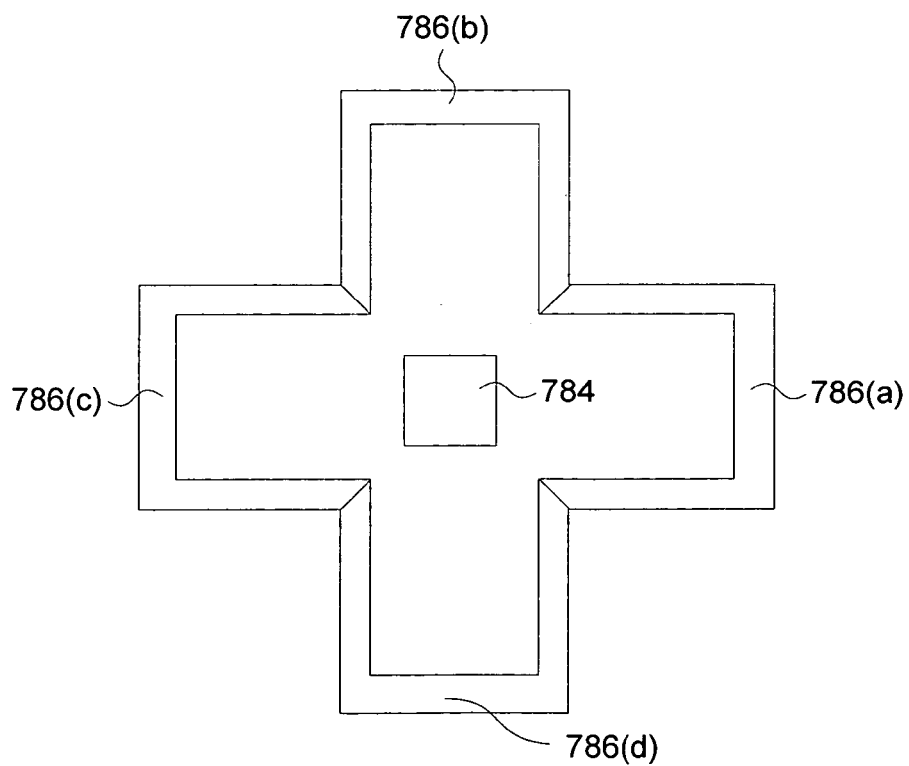

FIGS. 30A-30F illustrate some additional embodiments of the present invention related to switches. FIG. 30A depicts a switch 702 that includes a moveable beam 704 positioned between two actuation plates 706 and 708. Movable member 704 includes a contact tip 712 which can be made to contact lead 714 when appropriately actuated. This embodiment of FIG. 30A can use upper electrode 706 in addition to any spring force associated with moveable member 704 to help separate contactor 712 from lead 714. The embodiment of FIG. 30B can be used in an analogous manner to that of 30A where an additional contactor 718 is included which may be used to give the switch a double throw capability. FIG. 30C illustrates another switch embodiment that uses an electrode configuration 722 that is at least partially conformed to the shape of moving member 724 when moving member is deflected to contact element 726. FIG. 30D depicts a double throw switch embodiment which includes contour electrodes that at least partially mimic the shape of moving member 734 when deflected to contact elements 736 or 738. FIG. 30F depicts another alternative switch embodiment where a central electrode 744 is activated to pull an upper moveable member 746 and a lower movable member 748 together to make contact between elements 746 and 748. FIGS. 31A-31C depict additional embodiments of the present invention FIG. 31A depicts a beam 772 that is located above an electrode 774 where the electrode has walls 776 that approach the sides of beam 772. As a potential is placed between beam 772 and electrode 774, beam 772 is attracted downward toward the electrode where the attraction force is stronger then it would have been if electrode 774 were just a flat plate. Side walls 776 do not inhibit the motion of beam 772, but do lower the activation voltage necessary to displace bean 772. The beam 772 may be a cantilever beam supported at one end which is opposite to the end of the view of FIG. 31A. Alternatively, beam 772 may be a spring loaded plate that can move vertically up and down as apposed to undergoing a bending motion. FIG. 31 B depicts a similar embodiment to that of 31A with the exception that an upper electrode 782 is depicted which may be used to deflect the beam upward or to aid in pulling or releasing the beam from a contact position when it is deflected toward electrode 774. FIG. 31C shows an alternative embodiment where a beam 784 can be deflected in any of four directions by electrodes 786(*a*), 786(*b*), 786(*c*) or 786(*d*). As with some of the other embodiments alternatives to the embodiments of FIGS. 31A-31C may include dielectric stops, and the like, which may be helpful in minimizing contact between the beam and the electrodes.

The patent applications in the following table are hereby incorporated by reference herein as if set forth in full. The gist of each patent application is included in the table to aid the reader in finding specific types of teachings. It is not intended that the incorporation of subject matter be limited to those topics specifically indicated, but instead the incorporation is to include all subject matter found in these applications. The teachings in these incorporated applications can be combined with the teachings of the instant application in many ways. For example, the various apparatus configurations disclosed in these referenced applications may be used in conjunction with the novel features of the instant invention to provide various alternative apparatus that include the functionality disclosed herein:

| U.S. application No. Filing Date | Title Brief Description |
|---|---|
| U.S. application No. 09/488,142 Jan. 20, 2000 | Method for Electrochemical Fabrication This application is a divisional of the application that led to the above noted '630 patent. This application describes the basics of conformable contact mask plating and electrochemical fabrication including various alternative methods and apparatus for practicing EFAB as well as various methods and apparatus for constructing conformable contact masks |
| U.S. application No. 09/755,985 Jan. 5, 2001 | Microcombustor and Combustion-Based Thermoelectric Microgenerator Describes a generally toroidal counterflow heat exchanger and electric current microgenerator that can be formed using electrochemical fabrication. |
| U.S. application No. 60/379,136 May 7, 2002 | Selective Electrochemical Deposition Methods Having Enhanced Uniform Deposition Capabilities Describes conformable contact mask processes for forming selective depositions of copper using a copper pyrophosphate plating solution that allows simultaneous deposition to at least one large area (greater than about 1.44 mm$^2$) and at least one small area (smaller than about 0.05 mm$^2$) wherein the thickness of deposition to the smaller area is no less than one-half the deposition thickness to the large area when the deposition to the large area is no less than about 10 μm in thickness and where the copper pyrophosphate solution contains at least 30 g/L of copper. The conformable contact mask process is particularly focused on an electrochemical fabrication process for producing three-dimensional structures from a plurality of adhered layers. |
| U.S. application No. 60/379,131 May 7, 2002 | Selective Electrodeposition Using Conformable Contact Masks Having Enhanced Longevity Describes conformable contact masks that include a support structure and a patterned elastomeric material and treating the support structure with a corrosion inhibitor prior to combining the support and the patterned elastomeric material to improve the useful life of the mask. Also describes operating the plating bath at a low temperature so as to extend the life of the mask. |
| U.S. application No. 60/379,132 May 7, 2002 | Methods and Apparatus for Monitoring Deposition Quality During Conformable Contact Mask Plating Operations Describes an electrochemical fabrication process and apparatus that includes monitoring of at least one electrical parameter (e.g. voltage) during selective deposition using conformable contact masks where the monitored parameter is used to help determine the quality of the deposition that was |

-continued

| U.S. application No. Filing Date | Title Brief Description |
|---|---|
| | made. If the monitored parameter indicates that a problem occurred with the deposition, various remedial operations are undertaken to allow successful formation of the structure to be completed. |
| U.S. application No. 60/329,654 Oct. 15, 2001 | "Innovative Low-Cost Manufacturing Technology for High Aspect Ratio Microelectromechanical Systems (MEMS)" A conformable contact masking technique where the depth of deposition is enhanced by pulling the mask away from the substrate as deposition is occurring in such away that the seal between the conformable portion of the mask and the substrate shifts from the face of the conformal material and the opposing face of the substrate to the inside edges of the conformable material and the deposited material. |
| U.S. application No. 60/379,129 May 7, 2002 | Conformable Contact Masking Methods and Apparatus Utilizing In Situ Cathodic Activation of a Substrate An electrochemical fabrication process benefiting from an in situ cathodic activation of nickel is provided where prior to nickel deposition, the substrate is exposed to the desired nickel plating solution and a current less than that capable of causing deposition is applied through the plating solution to the substrate (i.e. cathode) to cause activation of the substrate, after which, without removing the substrate from the plating bath, the current is increased to a level which causes deposition to occur. |
| U.S. application No. 60/379,134 May 7, 2002 | Electrochemical Fabrication Methods With Enhanced Post Deposition Processing An electrochemical fabrication process for producing three-dimensional structures from a plurality of adhered layers is provided where each layer includes at least one structural material (e.g. nickel) and at least one sacrificial material (i.e. copper) that will be etched away from the structural material after the formation of all layers have been completed. A copper etchant containing chlorite (e.g. Enthone C-38) is combined with a corrosion inhibitor (e.g. sodium nitrate) to prevent pitting of the structural material during removal of the sacrificial material. |
| U.S. application No. 60/364,261 Mar. 13, 2002 | Electrochemical Fabrication Method and Apparatus for Producing Three-Dimensional Structures Having Improved Surface Finish An electrochemical fabrication (EFAB) process and apparatus are provided that remove material deposited on at least one layer using a first removal process that includes one or more operations having one or more parameters, and remove material deposited on at least one different layer using a second removal process that includes one or more operations having one or more parameters, wherein the first removal process differs from the second removal process by inclusion of at least one different operation or at least one different parameter. |
| U.S. application No. 60/379,133 May 7, 2002 | Method of and Apparatus for Forming Three-Dimensional Structures Integral With Semiconductor Based Circuitry An electrochemical fabrication (e.g. by EFAB ™) process and apparatus are provided that can form three-dimensional multi-layer structures using semiconductor based circuitry as a substrate. Electrically functional portions of the structure are formed from structural material (e.g. nickel) that adheres to contact pads of the circuit. Aluminum contact pads and silicon structures are protected from copper diffusion damage by application of appropriate barrier layers. In some embodiments, nickel is applied to the aluminum contact pad via solder bump formation techniques using electroless nickel plating. |
| U.S. application No. 60/379,176 May 7, 2002 | Selective Electrochemical Deposition Methods Using Pyrophosphate Copper Plating Baths Containing Citrate Salts An electrochemical fabrication (e.g. by EFAB ™) process and apparatus are provided that can form three-dimensional multi-layer structures using pyrophosphate copper plating solutions that contain a citrate salt. In preferred embodiments the citrate salts are provided in concentrations that yield improved anode dissolution, reduced formation of pinholes on the surface of deposits, reduced likelihood of shorting between anode and cathode during deposition processes, and reduced plating voltage throughout the period of deposition. A preferred citrate salt is ammonium citrate in concentrations ranging from somewhat more that about 10 g/L for 10 mA/cm$^2$ current density to as high as 200 g/L or more for a current density as high as 40 mA/cm$^2$. |
| U.S. application No. 60/379,135 May 7, 2002 | Methods of and Apparatus for Molding Structures Using Sacrificial Metal Patterns Molded structures, methods of and apparatus for producing the molded structures are provided. At least a portion of the surface features for the molds are formed from multilayer electrochemically fabricated structures (e.g. fabricated by the EFAB ™ formation process), and typically contain features having resolutions within the 1 to 100 μm range. The layered structure is combined with other mold components, as necessary, and a molding material is injected into the mold and hardened. The layered structure is removed (e.g. by etching) along with any other mold components to yield the molded article. In some embodiments portions of the layered structure remain in the molded article and in other embodiments an additional molding material is added after a partial or complete removal of the layered structure. |

| U.S. application No. Filing Date | Title Brief Description |
|---|---|
| U.S. application No. 60/379,177 May 7, 2002 | Electrochemically Fabricated Structures Having Dielectric Bases and Methods of and Apparatus for Producing Such Structures Multilayer structures are electrochemically fabricated (e.g. by EFAB ™) on a temporary conductive substrate and are there after are bonded to a permanent dielectric substrate and removed from the temporary substrate. The structures are formed from top layer to bottom layer, such that the bottom layer of the structure becomes adhered to the permanent substrate. The permanent substrate may be a solid sheet that is bonded (e.g. by an adhesive) to the layered structure or the permanent substrate may be a flowable material that is solidified adjacent to or partially surrounding a portion of the structure with bonding occurs during solidification. The multilayer structure may be released from a sacrificial material prior to attaching the permanent substrate or more preferably it may be released after attachment. |
| U.S. application No. 60/379,182 May 7, 2002 | Electrochemically Fabricated Hermetically Sealed Microstructures and Methods of and Apparatus for Producing Such Structures Multilayer structures are electrochemically fabricated (e.g. by EFAB ™) from at least one structural material (e.g. nickel), at least one sacrificial material (e.g. copper), and at least one sealing material (e.g. solder). The layered structure is made to have a desired configuration which is at least partially and immediately surrounded by sacrificial material which is in turn surrounded almost entirely by structural material. The surrounding structural material includes openings in the surface through which etchant can attack and remove trapped sacrificial material found within. Sealing material is located near the openings. After removal of the sacrificial material, the box is evacuated or filled with a desired gas or liquid. Thereafter, the sealing material is made to flow, seal the openings, and resolidify. |
| U.S. application No. TBD Dkt No. P-U.S.021-B-MG Dec. 3, 2002. | Electrochemically Fabricated Hermetically Sealed Microstructures and Methods of and Apparatus for Producing Such Structures Multilayer structures are electrochemically fabricated (e.g. by EFAB ™) from at least one structural material (e.g. nickel), at least one sacrificial material (e.g. copper), and at least one sealing material (e.g. solder). The layered structure is made to have a desired configuration which is at least partially and immediately surrounded by sacrificial material which is in turn surrounded almost entirely by structural material. The surrounding structural material includes openings in the surface through which etchant can attack and remove trapped sacrificial material found within. Sealing material is located near the openings. After removal of the sacrificial material, the box is evacuated or filled with a desired gas or liquid. Thereafter, the sealing material is made to flow, seal the openings, and resolidify. |
| U.S. application No. 60/379,184 May 7, 2002 | Multistep Release Method for Electrochemically Fabricated Structures Multilayer structures are electrochemically fabricated (e.g. by EFAB ™) from at least one structural material (e.g. nickel), that is configured to define a desired structure and which may be attached to a support structure, and at least a first sacrificial material (e.g. copper) that surrounds the desired structure, and at least one more material which surrounds the first sacrificial material and which will function as a second sacrificial material. The second sacrificial material is removed by an etchant and/or process that does not attack the first sacrificial material. Intermediate post processing activities may occur, and then the first sacrificial material is removed by an etchant or process that does not attack the at least one structural material to complete the release of the desired structure. |
| U.S. application No. 60/392531 Jun. 27, 2002 | Miniature RF and Microwave Components and Methods for Fabricating Such Components RF and microwave radiation directing or controlling components are provided that are monolithic, that are formed from a plurality of electrodeposition operations, that are formed from a plurality of deposited layers of material, that include inductive and capacitive stubs or spokes that short a central conductor of a coaxial component to the an outer conductor of the component, that include non-radiation-entry and non-radiation-exit channels that are useful in separating sacrificial materials from structural materials and that are useful, and/or that include surface ripples on the inside surfaces of some radiation flow passages. Preferred formation processes use electrochemical fabrication techniques (e.g. including selective depositions, bulk depositions, etching operations and planarization operations) and post-deposition processes (e.g. selective etching operations and/or back filling operations). |
| U.S. application No. 60/415,374 Oct. 1, 2002 | Monolithic Structures Including Alignment and/or Retention Fixtures for Accepting Components Permanent or temporary alignment and/or retention structures for receiving multiple components are provided. The structures are preferably formed monolithically via a plurality of deposition operations (e.g. electrodeposition operations). The structures typically include two or more positioning fixtures that control or aid in the positioning of components relative to one another, such features may include (1) positioning guides or stops that fix or at least partially limit the positioning of components in one or more orientations or directions, (2) retention elements that hold positioned components in desired orientations or locations, and (3) positioning and/or |

-continued

| U.S. application No. Filing Date | Title Brief Description |
|---|---|
| | retention elements that receive and hold adjustment modules into which components can be fixed and which in turn can be used for fine adjustments of position and/or orientation of the components. |
| U.S. application No. 10/271,574 Oct. 15, 2002 | Methods of and Apparatus for Making High Aspect Ratio Microelectromechanical Structures<br>Various embodiments of the invention present techniques for forming structures (e.g. HARMS-type structures) via an electrochemical extrusion (ELEX ™) process. Preferred embodiments perform the extrusion processes via depositions through anodeless conformable contact masks that are initially pressed against substrates that are then progressively pulled away or separated as the depositions thicken. A pattern of deposition may vary over the course of deposition by including more complex relative motion between the mask and the substrate elements. Such complex motion may include rotational components or translational motions having components that are not parallel to an axis of separation. More complex structures may be formed by combining the ELEX ™ process with the selective deposition, blanket deposition, planarization, etching, and multi-layer operations of EFAB ™. |
| U.S. application No. 60/422,008 Oct. 29, 2002 | EFAB Methods and Apparatus Including Spray Metal Coating Processes<br>Various embodiments of the invention present techniques for forming structures via a combined electrochemical fabrication process and a thermal spraying process. In a first set of embodiments, selective deposition occurs via conformable contact masking processes and thermal spraying is used in blanket deposition processes to fill in voids left by selective deposition processes. In a second set of embodiments, selective deposition via a conformable contact masking is used to lay down a first material in a pattern that is similar to a net pattern that is to be occupied by a sprayed metal. In these other embodiments a second material is blanket deposited to fill in the voids left in the first pattern, the two depositions are planarized to a common level that may be somewhat greater than a desired layer thickness, the first material is removed (e.g. by etching), and a third material is sprayed into the voids left by the etching operation. The resulting depositions in both the first and second sets of embodiments are planarized to a desired layer thickness in preparation for adding additional layers to form three-dimensional structures from a plurality of adhered layers. In other embodiments, additional materials may be used and different processes may be used. |
| U.S. application No. 60/422,007 Oct. 29, 2002 | Medical Devices and EFAB Methods and Apparatus for Producing Them<br>Various embodiments of the invention present miniature medical devices that may be formed totally or in part using electrochemical fabrication techniques. Sample medical devices include micro-tweezers or forceps, internally expandable stents, bifurcated or side branch stents, drug eluting stents, micro-valves and pumps, rotary ablation devices, electrical ablation devices (e.g. RF devices), micro-staplers, ultrasound catheters, and fluid filters. In some embodiments devices may be made out of a metal material while in other embodiments they may be made from a material (e.g. a polymer) that is molded from an electrochemically fabricated mold. Structural materials may include gold, platinum, silver, stainless steel, titanium or pyrolytic carbon-coated materials such as nickel, copper, and the like. |
| U.S. application No. 60/422,982 Nov. 1, 2002 | Sensors and Actuators and Methods and Apparatus for Producing Them<br>Various embodiments of the invention present sensors or actuators that include a plurality of capacitor (i.e. conductive) plates that can interact with one another to change an electrical parameter that may be correlated to a physical parameter such as pressure, movement, temperature, or the like or that may be driven may an electrical signal to cause physical movement. In some embodiments the sensors or actuators are formed at least in part via electrochemical fabrication (e.g. EFAB). |
| U.S. application No. TBD Dkt No. P-U.S.042-B-MG Nov. 26, 2002. | Multi-cell Masks and Methods and Apparatus for Using Such Masks To Form Three-Dimensional Structures<br>Multilayer structures are electrochemically fabricated via depositions of one or more materials in a plurality of overlaying and adhered layers. Selectivity of deposition is obtained via a multi-cell controllable mask. Alternatively, net selective deposition is obtained via a blanket deposition and a selective removal of material via a multi-cell mask. Individual cells of the mask may contain electrodes comprising depositable material or electrodes capable of receiving etched material from a substrate. Alternatively, individual cells may include passages that allow or inhibit ion flow between a substrate and an external electrode and that include electrodes or other control elements that can be used to selectively allow or inhibit ion flow and thus inhibit significant deposition or etching. |
| U.S. application No. TBD Dkt No. P-U.S.043-A-MG Nov. 26, 2002. | Non-Conformable Masks and Methods and Apparatus for Forming Three-Dimensional Structures<br>Electrochemical Fabrication may be used to form multilayer structures (e.g. devices) from a plurality of overlaying and adhered layers. Masks, that are independent of a substrate to be operated on, are generally used to achieve selective patterning. These masks may allow selective deposition of material onto the substrate or they may allow selective etching of a substrate where after the created voids may be filled with a selected material that may be |

-continued

| U.S. application No.<br>Filing Date | Title<br>Brief Description |
|---|---|
| | planarized to yield in effect a selective deposition of the selected material. The mask may be used in a contact mode or in a proximity mode. In the contact mode the mask and substrate physically mate to form substantially independent process pockets. In the proximity mode, the mask and substrate are positioned sufficiently close to allow formation of reasonably independent process pockets. In some embodiments, masks may have conformable contact surfaces (i.e. surfaces with sufficient deformability that they can substantially conform to surface of the substrate to form a seal with it) or they may have semi-rigid or even rigid surfaces. Post deposition etching operations may be performed to remove flash deposits (thin undesired deposits). |
| U.S. application No. TBD<br>Dkt No. P-U.S.044-A-MG<br>Dec. 3, 2002. | Miniature RF and Microwave Components and Methods for Fabricating Such Components<br>RF and microwave radiation directing or controlling components are provided that may be monolithic, that may be formed from a plurality of electrodeposition operations and/or from a plurality of deposited layers of material, that may include switches, inductors, antennae, transmission lines, filters, and/or other active or passive components. Components may include non-radiation-entry and non-radiation-exit channels that are useful in separating sacrificial materials from structural materials. Preferred formation processes use electrochemical fabrication techniques (e.g. including selective depositions, bulk depositions, etching operations and planarization operations) and post-deposition processes (e.g. selective etching operations and/or back filling operations). |

Additional material concerning microdevices and their fabrication can be found in the following three books which are hereby incorporated herein by reference as if set forth in full herein:

1. Multiple authors, The MEMS Handbook, edited by Mohamed Gad-El-Hak, CRC Press, 2002.
2. M. Madou, Fundamentals of Microfabrication, CRC Press, 2002.
3. Multiple authors, Micromechanics and MEMS, edited by William Trimmer, IEEE Press, 1997.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket deposition processes that are not electrodeposition processes. Some embodiments may use selective deposition processes on some layers that are not conformable contact masking processes and are not even electrodeposition processes. Some embodiments may use the non-conformable contact mask or non-contact masking techniques set forth in the above referenced U.S. Provisional Application corresponding to P-US042-B-MG.

Some embodiments may use nickel as a structural material while other embodiments may use different materials such as copper, gold, silver, or any other electrodepositable materials that can be separated from the a sacrificial material. Some embodiments may use copper as the structural material with or without a sacrificial material. Some embodiments may remove a sacrificial material while other embodiments may not. In some embodiments the sacrificial material may be removed by a chemical etching operation, an electrochemical operation, or a melting operation. In some embodiments the anode may be different from the conformable contact mask support and the support may be a porous structure or other perforated structure. Some embodiments may use multiple conformable contact masks with different patterns so as to deposit different selective patterns of material on different layers and/or on different portions of a single layer. In some embodiments, the depth of deposition will be enhanced by pulling the conformable contact mask away from the substrate as deposition is occurring in a manner that allows the seal between the conformable portion of the CC mask and the substrate to shift from the face of the conformal material to the inside edges of the conformable material.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A process for forming a multilayer microdevice, comprising:
   (a) forming a layer comprising at least two materials on a substrate that may include one or more previously deposited layers, each comprising at least two materials, wherein one of the at least two materials is a structural material and another of the at least two materials is a sacrificial material;
   (b) repeating the forming operation of "(a)" one or more times to form at least one subsequent layer, comprising at least two materials on at least one previously formed layer to build up a three-dimensional structure from a plurality layers;
   wherein the forming of at least a plurality of layers, comprises:
   (1) supplying a substrate;
   (2) supplying a mask on a surface of the substrate having a desired pattern of openings through which a first material of the at least two materials can be effectively deposited or etched to yield a desired pattern of the first material;
   (3) depositing the first material within the openings or etching the first material from the openings;
   (4) removing the mask;

(5) depositing a second material of the at least two materials to fill the void in the deposited material; and (6) planarizing the deposited first and second materials to provide a planarized layer; and (c) after formation of the plurality of layers removing the sacrificial material from the deposited structural material, to reveal the three-dimensional structure, wherein the microdevice includes a 3D tilt mirror.

2. The process of claim 1 wherein the depositing of the first material comprises electrodepositing the first material and the depositing of the second material comprises electrodepositing the second material.

3. The microdevice of claim 2 wherein the first and second deposited materials are metals.

4. The microdevice of claim 3 wherein the microdevice comprises a structure of overall dimension less than 1 centimeter with at least some design features having dimensions smaller than 500 microns.

5. The microdevice of claim 4 wherein at least some of the design features are smaller the 100 microns.

6. The microdevice of claim 5 wherein at least some of the design features are smaller than 25 microns.

7. The microdevice of claim 3 wherein the mirror comprises a rotatable structure with a reflective surface that is supported by at least one spring-like structure, wherein the spring-like structure is formed from the same material as that which forms the reflective surface.

8. The microdevice of claim 7 where the mirror can rotate around a first axis and about a second axis that is substantially perpendicular to the first axis, wherein the first axis is defined by first and second rod-like elements which produce a return force when twisted, wherein the first and second rod-like elements are supported by a loop shaped structure, which loop shaped structure is in turn supported by third and fourth rod-like elements which produce a return force when twisted, wherein the first and second rod-like elements are substantially co-linear along a first line and the third and fourth rod-like elements are substantially co-linear along a second line where-in the first and second lines are substantially perpendicular to one another.

9. The microdevice of claim 8 wherein the rotatable structure with the reflective surface has thickness dimension that is at least in part substantially thicker than the thickness dimension of the first and second rod-like elements, wherein portions of the rotatable structure may be thinner than a maximum thickness of the rotatable structure such that the moment of inertia of the rotatable structure is reduced.

10. The microdevice of claim 9 wherein the loop shaped structure has a thickness dimension that is substantially thicker than the thickness dimension of the third and forth rod-like elements.

11. The microdevice of claim 9 wherein the loop shaped structure has thickness dimension that is substantially thicker than the thickness dimension of the first and second rod-like elements.

12. The microdevice of claim 9 wherein the mirror is caused to rotate by activation of one or more of a plurality of electrodes located between the mirror and a substrate, wherein at least a plurality of the electrodes are separated from the substrate.

13. The microdevice of claim 12 wherein a parasitic capacitance of a circuit comprising the electrodes and the substrate is reduced from what the parasitic capacitance would have been if the electrodes were formed on the substrate.

14. The microdevice of claim 3 wherein the mirror is caused to rotate by activation of one or more of a plurity of electrodes located between a dielectric substrate and the mirror where each of the plurality of electrodes is formed from a plurality of layers with the configuration of structural material forming each electrode on each layer configured to provided closer proximity to the mirror when in an undeflected state in regions where tilting is less and further seperation in regions where the mirror tilts further during deflection such that the electrodes provide enhanced driving force without obstructing movement of the mirror.

15. The microdevice of claim 3 wherein a plane of a reflective surface of the mirror as formed is coincident with a boundary level of one of the layers.

* * * * *